(12) United States Patent
Liu

(10) Patent No.: US 12,147,363 B2
(45) Date of Patent: Nov. 19, 2024

(54) METHOD AND DEVICE, AND NON-TRANSITORY COMPUTER-READABLE STORAGE MEDIUM TO SELECT MEMORY REQUEST BASED ON NORMALIZED CLOCK COUNT AND TIMESLOT VALUES

(71) Applicant: ZEKU TECHNOLOGY (BEIJING) CORP., LTD., Beijing (CN)

(72) Inventor: Jun Liu, Beijing (CN)

(73) Assignee: ZEKU TECHNOLOGY (BEIJING) CORP., LTD., Beijing (CN)

( * ) Notice: Subject to any disclaimer, the term of this patent is extended or adjusted under 35 U.S.C. 154(b) by 0 days.

(21) Appl. No.: 18/311,225

(22) Filed: May 2, 2023

(65) Prior Publication Data

US 2023/0273747 A1 Aug. 31, 2023

Related U.S. Application Data

(63) Continuation of application No. PCT/CN2021/120253, filed on Sep. 24, 2021.

(30) Foreign Application Priority Data

Nov. 13, 2020 (CN) .......................... 202011273078.2

(51) Int. Cl.
G06F 13/16 (2006.01)
(52) U.S. Cl.
CPC ............................... *G06F 13/1689* (2013.01)
(58) Field of Classification Search
CPC ...................... G06F 13/1689; G06F 3/0659
See application file for complete search history.

(56) References Cited

U.S. PATENT DOCUMENTS

| 7,158,510 | B1 | 1/2007 | Golla et al. |
| 2005/0204085 | A1 | 9/2005 | Fukuyama et al. |
| 2019/0057047 | A1* | 2/2019 | Hsu .................. G06F 13/18 |

FOREIGN PATENT DOCUMENTS

| CN | 1929471 | 3/2007 |
| CN | 104468156 | 3/2015 |

(Continued)

OTHER PUBLICATIONS

CNIPA, First Office Action for CN Application No. 202011273078.2, Jan. 6, 2022.

(Continued)

*Primary Examiner* — Chie Yew
(74) *Attorney, Agent, or Firm* — Hodgson Russ LLP

(57) ABSTRACT

An arbitration method, device, and computer-readable storage medium are provided. In an N-th clock cycle, P first requests respectively sent by P processing modules are obtained among M processing modules, where the M processing modules are each configured to send a first request to a memory module via an arbitration module, M is an integer greater than or equal to P, N is an integer greater than or equal to zero, and P is an integer greater than or equal to two. P timeslot values to be respectively allocated to IDs of the P processing modules are determined from a first timeslot table. A target request to be sent to the memory module in the N-th clock cycle is determined among the P first requests according to a normalized clock-cycle count corresponding to the N-th clock cycle and the P timeslot values.

20 Claims, 9 Drawing Sheets

---

OBTAIN, IN AN N-TH CLOCK CYCLE, P FIRST REQUESTS RESPECTIVELY SENT BY P PROCESSING MODULES AMONG M PROCESSING MODULES — S601

DETERMINE, FROM A FIRST TIMESLOT TABLE, P TIMESLOT VALUES TO BE RESPECTIVELY ALLOCATED TO IDS OF THE P PROCESSING MODULES — S603

DETERMINE, AMONG THE P FIRST REQUESTS, A TARGET REQUEST TO BE SENT TO THE MEMORY MODULE IN THE N-TH CLOCK CYCLE, ACCORDING TO A NORMALIZED CLOCK-CYCLE COUNT CORRESPONDING TO THE N-TH CLOCK CYCLE AND THE P TIMESLOT VALUES — S605

(56) References Cited

FOREIGN PATENT DOCUMENTS

| CN | 106294227 | 1/2017 |
|---|---|---|
| CN | 106681947 | 5/2017 |
| CN | 111327391 | 6/2020 |
| JP | H08129524 | 5/1996 |
| JP | H10228446 | 8/1998 |
| JP | 2005215980 | 8/2005 |
| JP | 2005258867 | 9/2005 |
| JP | 2006195867 | 7/2006 |
| WO | 2012075836 | 6/2012 |

OTHER PUBLICATIONS

WIPO, International Search Report and Written Opinion for International Application No. PCT/CN2021/120253, Dec. 13, 2021.
EPO, Extended European Search Report for EP Application No. 21890824.2, Feb. 26, 2024.
JPO, Office Action for JP Application No. 2023-528605, Apr. 9, 2024.

* cited by examiner

METHOD AND DEVICE, AND NON-TRANSITORY COMPUTER-READABLE STORAGE MEDIUM TO SELECT MEMORY REQUEST BASED ON NORMALIZED CLOCK COUNT AND TIMESLOT VALUES

CROSS-REFERENCE TO RELATED APPLICATION(S)

This application is a continuation of International Application No. PCT/CN2021/120253, filed Sep. 24, 2021, which claims priority to Chinese Patent Application No. 202011273078.2, filed Nov. 13, 2020, the entire disclosures of which are incorporated herein by reference.

TECHNICAL FIELD

This disclosure relates to, but is not limited to, electronic technologies, and in particular, to an arbitration method and device and a non-transitory computer-readable storage medium.

BACKGROUND

With the development of communication technologies, more and more services are supported by a communication device, and data throughput between a processing module and a memory module in the communication device is increased, which imposes higher requirements on performance of an arbiter. How to design an arbitration strategy for the arbiter so as to improve an arbitration efficiency of the arbiter is an urgent problem to be solved in the art.

SUMMARY

In a first aspect, an arbitration method is provided. The method includes the following. In an N-th clock cycle, P first requests respectively sent by P processing modules are obtained among M processing modules, where the M processing modules are each configured to send a first request to a memory module via an arbitration module, M is an integer greater than or equal to P, N is an integer greater than or equal to zero, and P is an integer greater than or equal to two. P timeslot values to be respectively allocated to IDs of the P processing modules are determined from a first timeslot table. A target request to be sent to the memory module in the N-th clock cycle is determined among the P first requests according to a normalized clock-cycle count corresponding to the N-th clock cycle and the P timeslot values.

In a second aspect, an arbitration device is provided. The arbitration device includes an arbitration module, and the arbitration module includes a memory and a processor. The memory is configured to store a computer program capable of running on a processor. The processor is configured to implement operations of the above method when executing the computer program.

In a third aspect, a non-transitory computer-readable storage medium is provided. The computer storage medium stores one or more programs, and the one or more programs are executable by one or more processors to implement operations of the above method.

BRIEF DESCRIPTION OF THE DRAWINGS

In order to describe technical solutions of implementations of the present disclosure more clearly, the following will give a brief introduction to the accompanying drawings used for describing the implementations. The accompanying drawings are incorporated into the specification and constitute a part of the specification, and these accompanying drawings illustrate implementations consistent with the present disclosure and are used to describe the technical solutions of the present disclosure together with the description.

DETAILED DESCRIPTION

The technical solutions of the present disclosure will be described in detail hereinafter with reference to implementations and the accompanying drawings. The following several specific implementations may be combined with each other, and the same or similar concepts or processes may not be repeated in certain implementations.

It should be noted that, in implementations of the present disclosure, "first" and "second" are used to distinguish similar objects, and are not necessarily used to describe a specific sequence or order. In addition, the technical solutions disclosed in implementations of the present disclosure can be combined randomly without conflict.

When multiple requests for accessing the same physical memory block occur in the same clock cycle, a memory conflict occurs. In order to solve a memory conflict, a concept of an arbiter (also referred to as a memory arbiter (MA)) is proposed. The arbiter may be coupled with the memory block, and may determine an order for accessing the memory block according to a priority scheme. When multiple access requests or multiple storage requests for one memory block exist in one clock cycle, a general arbiter may enable one access request or one storage request to reach the memory block in said one clock cycle, other access requests or storage requests in said one clock cycle are unable to reach the memory block, and pipeline stall will occur, where pipeline stall may be understood as pipeline stagnation.

Figure 1:
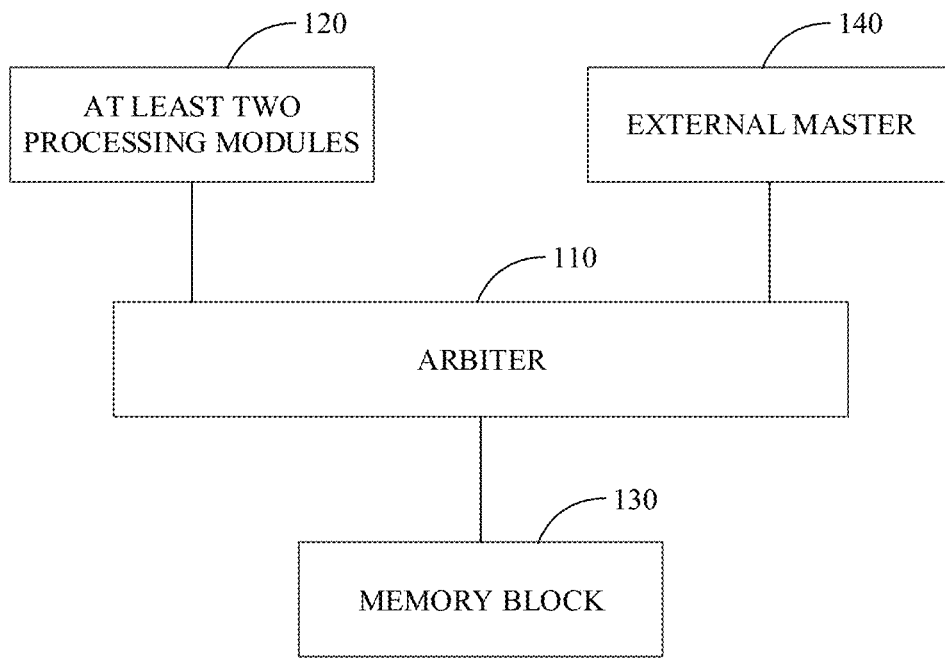
FIG. 1 is a schematic structural diagram of a data processing apparatus provided in implementations of the present disclosure.

FIG. 1 is a schematic structural diagram of a data processing apparatus provided in implementations of the present disclosure. As illustrated in FIG. 1, the data processing apparatus 100 includes an arbiter 110, at least two processing modules 120, a memory block 130, and an external master 140.

In the N-th clock cycle, any one or more of the at least two processing modules 120 and/or the external master 140 may each send a first request to the memory block 130 via the arbiter 110, where the first request may be a read request for reading data from the memory block 130, or a write request for writing data into the memory block 130. For example, when the first request is a read request, the at least two processing modules 120 and the external master 140 each send a first request to the memory block 130 via the arbiter 110 in the N-th clock cycle, the arbiter 110 can only have one first request sent to the memory block 130 in the N-th clock cycle, or in other words, the arbiter 110 can only authorize one first request in the N-th clock cycle, while other unauthorized first requests will be in a waiting state until to be authorized in later clock cycles. The term "authorize" in implementation of the present disclosure may be understood as "acknowledge".

Figure 2:
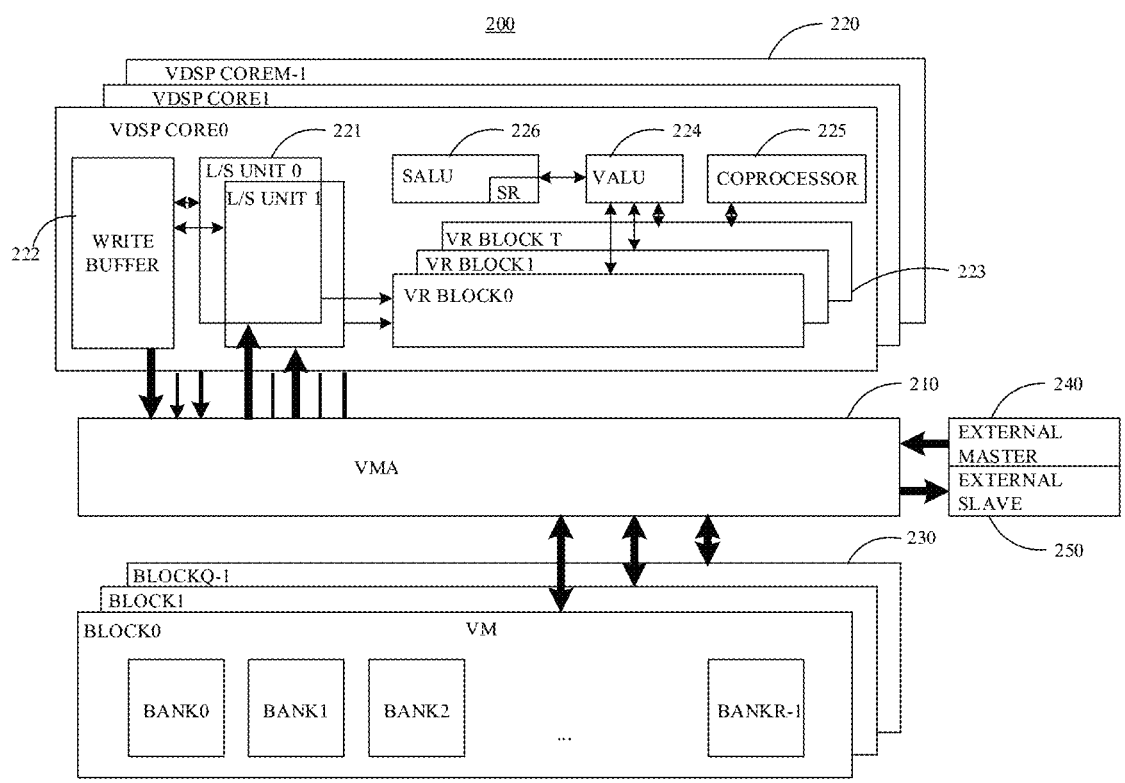
FIG. 2 is a schematic structural diagram of another data processing apparatus provided in implementations of the present disclosure.

FIG. 2 is a schematic structural diagram of another data processing apparatus provided in implementations of the present disclosure. As illustrated in FIG. 2, the data processing apparatus 200 includes a vector memory arbitrator (VMA) 210, M vector digital signal processing (VDSP) cores 220, Q vector memory blocks (VM Block) 230, an external master 240, and an external slave 250. M and Q may be each an integer greater than or equal to 1. The above arbiter 110 may include a VMA, and the above processing module may include a VDSP core. In other implementations, the above arbiter 110 may include an MA.

The M VDSP Cores 220 may be VDSP Core0, VDSP Core1, VDSP CoreM−1, and so on, and the Q VM Blocks 230 may be Block 0, Block 1, Block Q−1, and so on.

The VMA 210 may be connected with the M VDSP cores 220, the Q VM Blocks 230, the external master 240, and the external slave 250, respectively. The VMA 210 provides data access between each VM Block (Block 0, Block 1, or Block Q−1) and each VDSP core (VDSP Core0, VDSP Core1, VDSP CoreM−1), data access each VM Block (Block 0, Block 1, or Block Q−1) and the external master 240, data access between the external slave 250 and each VDSP core (VDSP core 0, VDSP core 1, or VDSP core M−1), or data access between the external slave 250 and the external master 240. For example, any one of the M VDSP cores 220 may send a first request to any one of the N VM Blocks through the VMA 210; any one of the VDSP cores may send the first request to the external slave 250 through the VMA 210; the external master 240 may send the first request to any one of the VM Blocks through the VMA 210; and the external master 240 may also send the first request to the external slave 250 through the VMA 210. The first request may be a read request or a storage request.

Each VDSP core may include a load/store (L/S) unit 221, a write buffer 222, a vector register block (VR block) 223, a vector arithmetic and logic unit (VALU) 224, a coprocessor 225, and a scalar arithmetic and logic unit (SALU) 226. The SALU 226 may have a scalar resource (SR). When performing related calculation, the VALU 224 may invoke the SR in the SALU 226. In implementations of the present disclosure, the L/S unit may be implemented as one or at least two L/S units, and the VR block may be implemented as one or at least two VR blocks, which is not limited in implementations of the present disclosure. For example, in an implementation corresponding to FIG. 2, the L/S unit 221 includes two L/S units, which are respectively L/S unit 0 and L/S unit 1, and the VR block 223 includes VR block 0, VR block 1, VR block T, and the like, where T is an integer greater than or equal to 1.

Unless described in implementations of the present disclosure, reading or writing once refers to reading or writing in one clock cycle.

For each VDSP core, the VDSP core may issue to the VMA 210, according to at least one L/S unit of the VDSP core and through a load port of the at least one L/S unit, at least one request for reading data and may issue to the VMA 210, according to the write Buff of the VDSP core, a request for writing data. Access from the load port of the at least one L/S unit and from a write-buff-port may be directed to the VM through a vm-port, or may be directed to the external slave 250 through an external slave-port (es-port). The external master 240 having direct memory access (DMA), as well as the processor of other systems, may be directed to the VM from an external master-port (em-port) 240 to the VM-port.

From the perspective of the VMA 210, the vm-port and the es-port are for passive operations, while the load port, the write-buff-port, and the em-port are ports for actively requesting. Access from the em-port may be allocated to several cycles. All requests come from a system bus. The system bus connects various master devices and slave devices. Dedicated requests to the VM are queued and routed. Therefore, the requests may be sparse and random in some random phases, and delivered to the VMA 210 in a disordered or ordered sequence.

By providing multiple VM Blocks, the multiple VM Blocks can be accessed at the same time in the same clock cycle, thereby reducing the possibility of memory conflict. If at least two requests access one VM Block at the same time in the same clock cycle, a block conflict (or referred to as memory conflict) occurs, the VMA 210 may arbitrate between the at least two requests, one request will be authorized in the clock cycle, and an unauthorized request is required to wait for the next clock cycle until to be authorized.

For adaptability and flexibility, each VM Block may include at least two Banks. For example, Banks included in one VM Block in implementation of the present disclosure may be Bank0, Bank1, Bank2, BankR−1, and the like, where R may be the same as or different from M. A storage width of one Bank may be aligned with a data width of a vector lane element, so that a width of data that can be read once or a width of data that can be stored one is the storage width of one Bank. In each VM Block, addresses of Banks may be interleaved.

In some implementations, when a read request indicates reading data from at least two Banks in one VM Block, the VMA 210 may authorize the read request to read data from one Bank in said one VM Block in a current clock cycle, and then read data from other Banks in later clock cycles. That is, data of one Bank can be read in one clock cycle.

A bandwidth of the VM Block may be the same as a bandwidth of the L/S unit, and may also be the same as a width of the VR Block, so that data can be sent between the VR Block and the VM Block by means of a single-cycle load operation or a single-cycle storage operation.

A VDSP core may include at least two L/S units. In order to avoid conflict when one VDSP core accesses the Q VM Blocks 230 with full bandwidth, the number of VM Blocks may be greater than or equal to the number of L/S units in one VDSP core. For example, as illustrated in FIG. 2, the number of VM Blocks is 3, and the number of L/S units in one VDSP core is 2.

Figure 3:
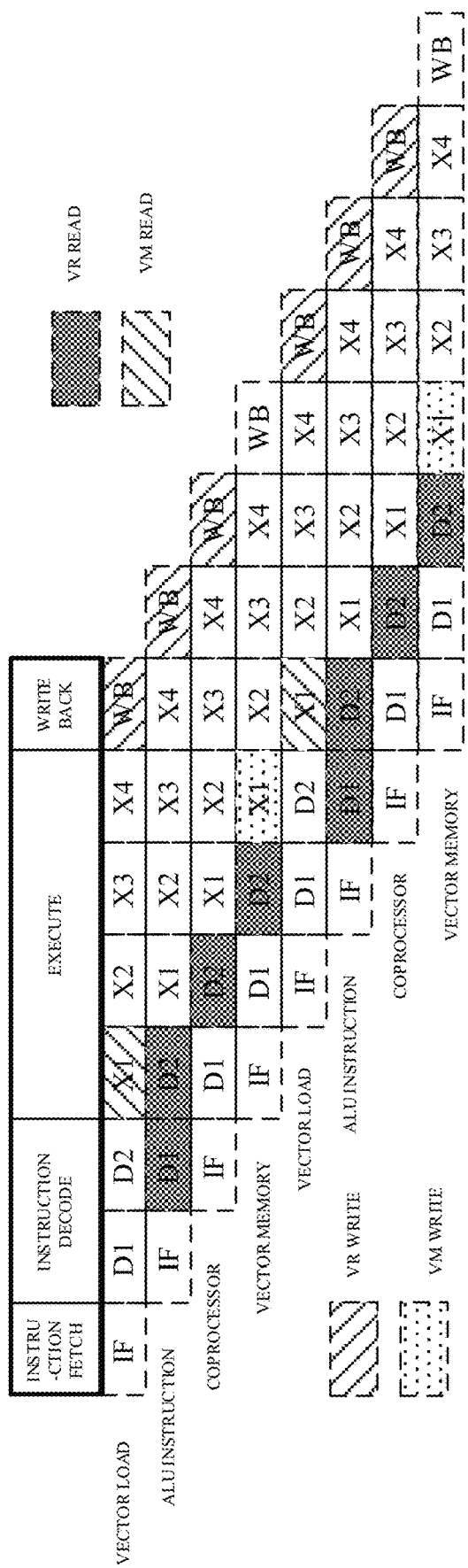
FIG. 3 is a schematic diagram of a pipeline of a working process of a data processing apparatus provided in implementations of the present disclosure.

FIG. 3 is a schematic diagram of a pipeline of a working process of a data processing apparatus provided in implementations of the present disclosure. As illustrated in FIG. 3, an instruction execution stage may be divided into four stages, which are an instruction-fetch stage, an instruction-decode stage, an instruction-execute stage, and an instruction-write-back stage.

In the instruction-fetch stage, the L/S unit obtains instructions and stores all the obtained instructions in the VR Block. In the instruction-decode phase, the VALU and/or the coprocessor decodes the instructions in the VR Block, and in each decode phase, the VALU and/or the coprocessor reads and registers an operand from the VR Block. The instruction-execute stage may be divided into Es sub-stages, where Es may be 4. For example, the Es sub-stages may include sub-stage X1, sub-stage X2, sub-stage X3, and sub-stage X4. In each sub-stage, an ALU instruction processes a vector lane (vLane) and consumes a total of Es vLanes. In the instruction-write-back stage, an execution result is cyclically written back to a target VR Block, and the target VR Block may be the same as or different from the VR Block storing the instruction.

A length of an instruction cycle may be defined by the number (Es) of vLanes, and therefore, for a full pipeline having a vector load instruction, an ALU instruction, a coprocessor instruction, and a vector memory instruction, one VM Block can be read and written only once in each instruction cycle due to an access mode of the VDSP core to the VM Block.

With continued reference to FIG. 3, when the vector load instruction is executed, reading data from the VM Block or a read instruction is executed in the third clock cycle (namely, in the sub-stage X1), and the read data is written into the VR Block in the last clock cycle. When the ALU instruction is executed, the VALU can read data from the VR Block in the first clock cycle and the second clock cycle, and write a processing result back to the VR Block in the last clock cycle. When the coprocessor instruction is executed, the coprocessor can read data from the VR Block in the second clock cycle, and write a processing result back to the VR Block in the last clock cycle. When the vector memory instruction is executed, the L/S unit reads data from the VR Block in the second clock cycle, and writes data back to the VM Block through the write buff in the third clock cycle. In this way, a full pipeline is completed, and then a multi-core VDSP system (which may be a data processing apparatus corresponding to FIG. 1, FIG. 2, or FIG. 13 described below) may continue to execute the full pipeline cyclically.

As can be seen, the vector load instruction or the vector memory instruction is executed every four cycles during execution of the pipeline. After data is read from the VM Block in one clock cycle, and data is written into the VM Block in the third clock cycle since said one clock cycle.

In a multi-core VDSP system, the VMA mainly solves a conflict generated by write requests or read requests sent from multiple VDSP cores at the same time to a certain VM Block, the VMA is mainly designed to reduce stall time (or, a clock cycle occupied by a stall) of a write request or a read request which is not authorized.

An arbitration manner in the related art is introduced below, and in this arbitration manner, a first request authorized in a current clock cycle is determined according to formula (1).

$$GRANT_n = \begin{cases} k & \text{if } CORERD_n[k] == 1 \text{ and } n \% M == k \\ NULL & \text{otherwise} \end{cases} \quad (1)$$

M represents the number of VDSP cores that can access the VM Block via the VMA. $GRANT_n$ represents an identity (ID) of a VDSP core authorized in an N-th clock cycle, where the ID of the VDSP core may refer to a serial number or a sequence number of a VDSP core, and the ID of the VDSP core is an integer greater than or equal to 0. A VDSP core corresponding to an authorized ID of the VDSP core can read data from the VM Block or write data into the VM Block in the N-th clock cycle. When $GRANT_n$ is NULL, it means that no request reach a specific VM Block in the N-th clock cycle, and When $GRANT_n$ is not NULL, it means that one request reaches a specific VM Block in the N-th clock cycle. k indicates an ID of a VDSP core, and $CORERD_n[k]$ indicates that the VDSP core with the ID k sends a read request signal to the VMA in the N-th clock cycle.

Figure 4:
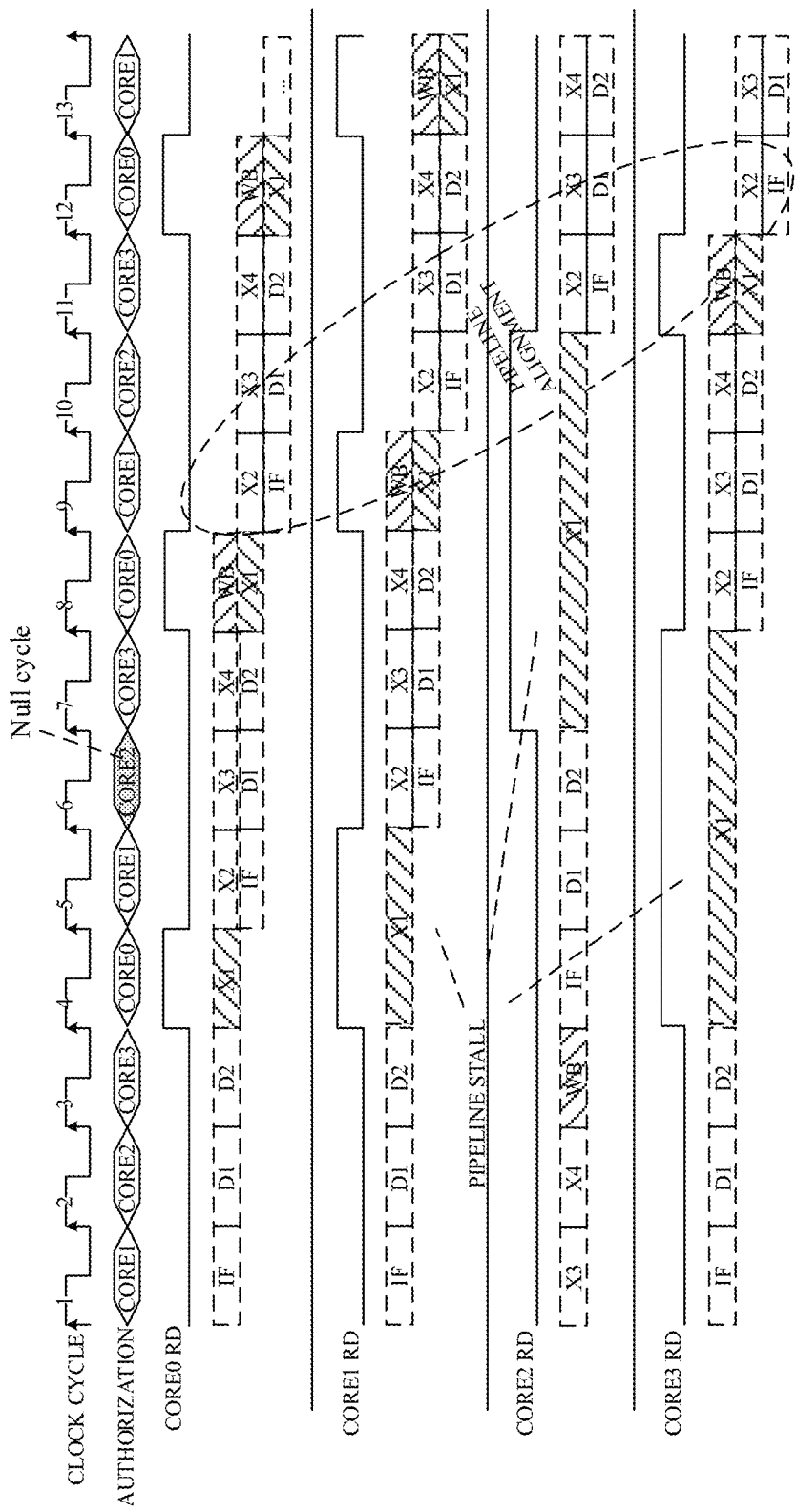
FIG. 4 is a schematic diagram of an arbitration manner provided in the related art.

FIG. 4 is a schematic diagram of an arbitration manner provided in the related art. An arbitration method used in the arbitration manner may be a round-robin arbitration method. As illustrated in FIG. 4, for example, the number of VDSPs cores is four, which are Core0, Core1, Core2, and Core3 respectively, and read signals sent by Core0, Core1, Core2, and Core3 may be signal Core® RD, signal Core1 RD, signal Core2 RD, and signal Core3 RD, respectively.

In the fourth clock cycle, Core 0 sends Signal Core® RD, Core 1 sends Signal Core1 RD, and Core 3 sends Signal Core3 RD. According to formula (1), the clock cycle n modulo the number of cores M (n % M) equals to 0, therefore signal Core® RD sent by Core® is authorized in the fourth clock cycle, and signal Core® RD is responded to turn into a low level, so that a next read instruction starts to be executed in the fifth clock cycle, and Core® sends signal Core® RD in the eighth clock cycle.

Signal Core® RD sent by Core® is authorized in the fourth clock cycle, therefore signal Core1 RD and signal Core3 RD are unable to be responded, so that the pipeline is stall, that is, the pipeline is in a stall state. In the fifth clock cycle, the clock cycle n modulo the number of cores M (n % M) equals to 1, and therefore signal Core1 RD is authorized by the VDSP core, and signal Core1 RD is responded to turn into a low level.

In the sixth clock cycle, the clock cycle n modulo the number of cores M (n % M) equals to 2, however in the sixth clock cycle, the VMA does not obtain signal Core2 RD sent by Core2, therefore, in the sixth clock cycle, signal Core3 RD is still unable to be responded, the pipeline is still in the pipeline stall state, and signal Core3 RD will be authorized in the seventh clock cycle. Signal Core2 RD received by the VMA in the seventh clock cycle is unable to be authorized until the 10th clock cycle.

It can be seen that, when the VMA receives multiple read requests, the VMA may determine a read request authorized in a current clock cycle according to the count of the current clock cycle, and a pipeline of the un-authorized read signal stalls in the current clock cycle. After several clock cycles, when all sub-stages X1 in the pipeline are aligned with allocated VM timeslots, that is, when the pipeline is aligned, conflict is eliminated. In implementations of the present disclosure, a timeslot may be understood as a clock cycle, and one timeslot may be understood as one clock cycle.

However, a disadvantage of the implementation corresponding to FIG. 4 lies in that, when $CORERD_n[k]==0$, n % M==k, and $CORERD_n[l]==1$, the VMA does not authorize core to read the VM Block, and timeslot k is not occupied by core 1, so that the VMA does not authorize any request when there is still an unauthorized request in a clock cycle, and this null cycle increases a total stall cycle of a VDSP system.

Another arbitration manner in the related art is introduced below, and in the arbitration manner, a first request authorized in a current clock cycle is determined according to formula (2).

$$GRANT_n = \begin{cases} \text{NULL} & \text{if } CORERD_n[0 \ldots M-1] == 0 \\ \text{random}(\{K\}) & \text{otherwise} \end{cases} \quad (2)$$

M represents the number of VDSP cores that can access the VM Block via the VMA, n represents the count of the current clock cycle, and $GRANT_n$ represents an ID of a VDSP core authorized in the n-th clock cycle. $CORERD_n[0 \ldots M-1]==0$ represents none of Core 0 to Core 1 send any first request to the VMA in the n-th clock code. Random 0 is a pseudo-random method for selecting a member from a non-empty assembly. For example, {K}=1, random({K})=1; and {K}=2, 3, random({K})=2 or 3.

Figure 5:
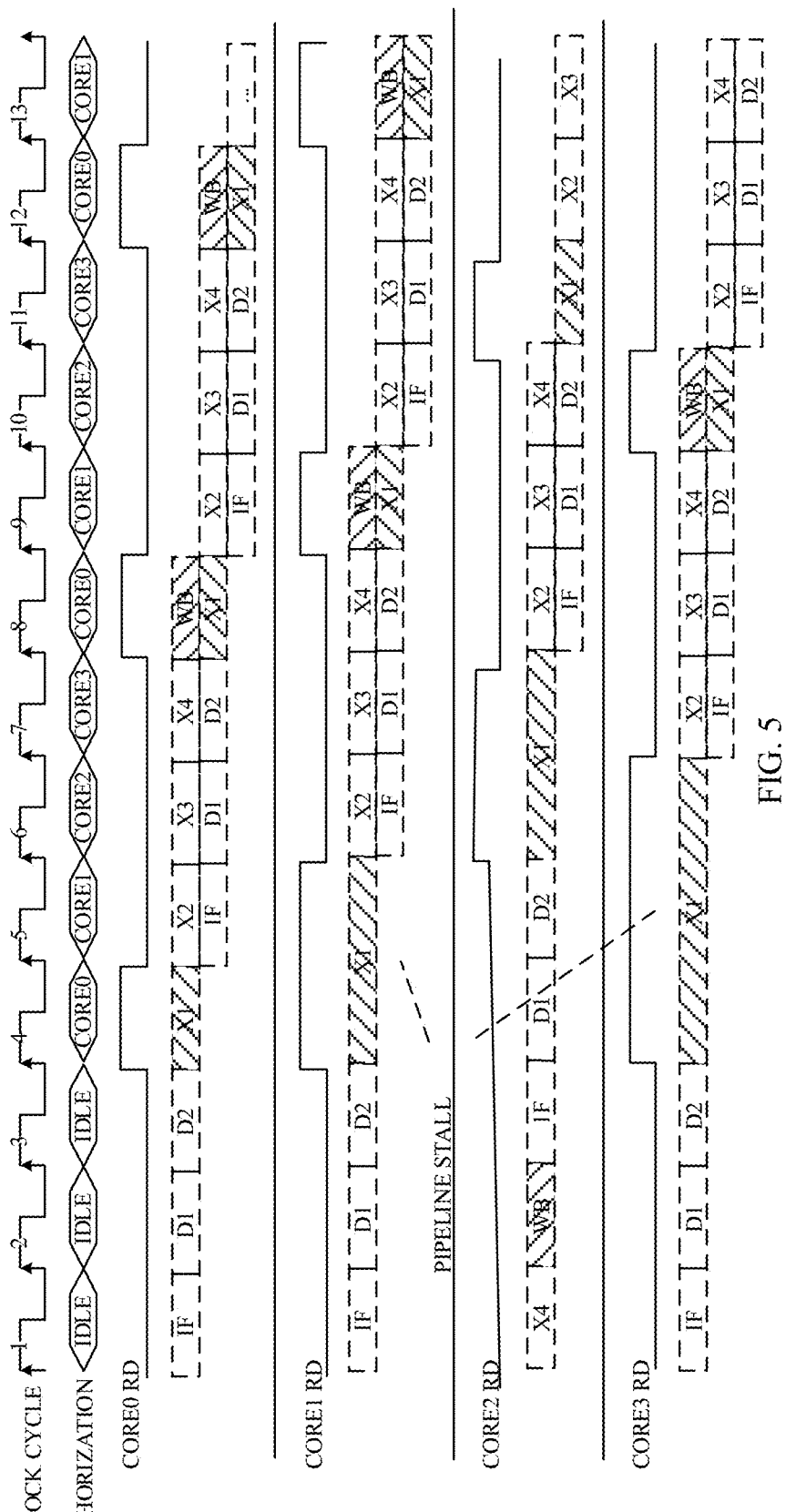
FIG. 5 is a schematic diagram of another arbitration manner provided in the related art.

FIG. 5 is a schematic diagram of another arbitration manner provided in the related art. An arbitration method used in the arbitration manner may be fair first input first output (FIFO). As illustrated in FIG. 5, the number of VDSP cores is four, which are Core0, Core1, Core2, and Core3 respectively, and read signals sent by Core0, Core1, Core2 and Core3 may be signal Core0 RD, signal Core1 RD, signal Core2 RD, and signal Core3 RD, respectively.

In the fourth clock cycle, Core® sends signal Core® RD, Core1 sends signal Core1 RD, and Core3 sends signal Core3 RD. {K}=0, 1, and 3, and according to formula (2), Core 0 is determined to be authorized to send signal Core® RD in the fourth clock cycle. In the fifth clock cycle, {K}=1, and 3, and according to formula (2), Core 1 is determined to be authorized to send signal Core1 RD; and in the sixth clock cycle, {K}=3, and according to formula (2), Core 3 is determined to be authorized to send signal Core3 RD. In this implementation, pipeline stall will occur to signal Core1 RD and signal Core3 RD since the fourth clock cycle.

In some implementations, the VMA may always authorize a read request that is received first, for example, reference is made to FIG. 5, if the VMA receives signal Core2 RD in the sixth clock cycle, the VMA authorizes signal Core3 RD instead of signal Core2 RD, which will cause pipeline stall of signal Core2 RD since the sixth clock cycle.

In implementations of the present disclosure, when an undecided read request is sent to the VMA, a request authorized by the VMA is irrelevant to a clock cycle and timeslot allocation, the VMA always serves a VDSP Core, and therefore, in this arbitration manner, there is no null clock cycle.

Reference is made to FIGS. 4 and 5, compared with the first related technology, the second related technology reduces the number of times that the pipeline stall occurs.

However, a disadvantage of the solution corresponding to FIG. 5 lies in that if a signal is not authorized in the current clock cycle, and another signal comes in the next clock cycle, said another signal will stall, that is, a new stall cycle is introduced.

Figure 6:
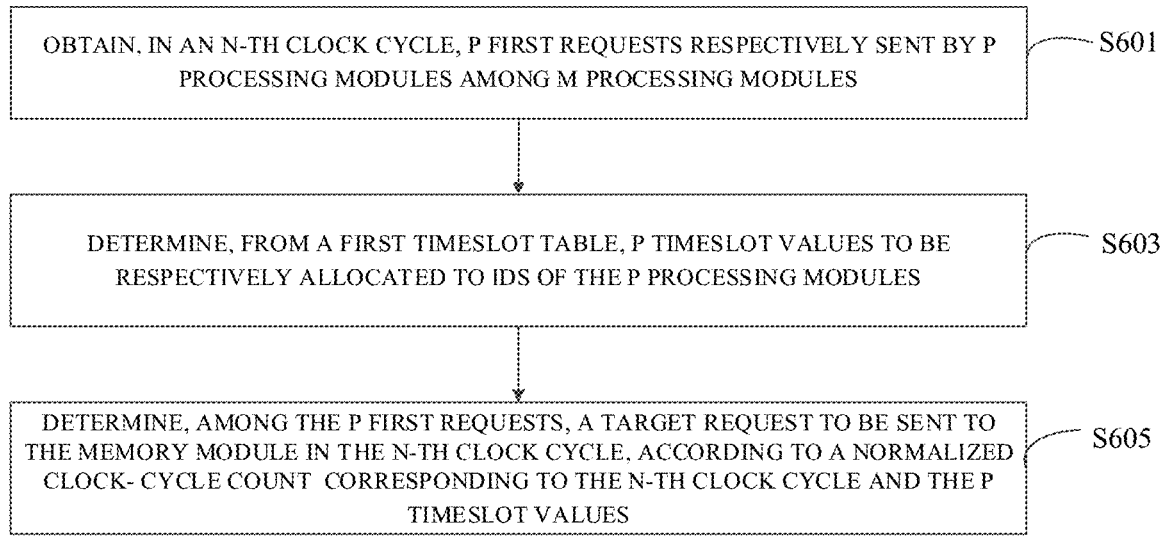
FIG. 6 is a schematic flowchart of an arbitration method provided in implementations of the present disclosure.

FIG. 6 is a schematic flowchart of an arbitration method provided in implementations of the present disclosure. As illustrated in FIG. 6, the method can be applied to an arbitration module, and the method includes the following.

S601, P first requests respectively sent by P processing modules among M processing modules are obtained in the N-th clock cycle.

The M processing modules are each configured to send a first request to a memory module via an arbitration module. M is an integer greater than or equal to P, N is an integer greater than or equal to zero, and P is an integer greater than or equal to two.

The arbitration module may be an arbiter. The arbiter in implementations of the present disclosure may be the VMA mentioned above, and in other implementations, the arbiter may be a memory arbitrator (MA). The arbitration module is configured to authorize or acknowledge the first request obtained, and the arbitration module may send the first request for authorized or acknowledged to the memory module.

In some implementations, the memory module may be any one of the VM Blocks mentioned above, or the memory module may include one of the following: a memory block, a read-only memory (ROM), a random access memory (RAM), a dynamic random access memory (DRAM), a static random-access memory (SRAM), a synchronous dynamic random access memory (SDRAM), and a double data rate (DDR) SDRAM. The memory module in implementations of the present disclosure may be any one of the foregoing Q VM Blocks.

The M processing modules may be the M VDSP cores. In some implementations, each of the M processing modules includes one of the following: a digital signal processing (DSP) core, a micro controller unit (MCU), a field programmable gate array (FPGA), advanced reduced instruction set computer (RISC) machines (ARM), a central processing unit (CPU), and an application specific integrated circuit (ASIC).

In some implementations, the first request may include a read request to read data from the memory module. In other implementations, the first request may include a write request to write data into the memory module.

Each of the M processing modules may send a first request to the memory module via the arbitration module. In some implementations, each of the M processing modules may send a read request to the memory module via the arbitration module, or the arbitration module may send a write request to the memory module, so that the arbitration module can arbitrate a read request currently to be sent to the memory module from at least two read requests, or the arbitration module can arbitrate a write request currently to be sent to the memory module from at least two write requests. A clock cycle for sending the read request and a clock cycle for sending the write request by each processing module are different.

The M processing modules may include the 0th processing module (a corresponding ID being 0), and the first processing module (a corresponding ID being 1), . . . , up to the (M−1)-th processing module (a corresponding ID being M−1). IDs corresponding to the M processing modules may be 0, 1, and up to M−1.

In implementations of the present disclosure, the N-th clock cycle may be the same as the foregoing n-th clock cycle.

None of the P first requests have been authorized by the arbitration module.

In some implementations, the P first requests are sent by the P processing modules respectively in the N-th clock cycle. For example, when M is 4, in the implementation corresponding to FIG. 5, the arbitration module may receive, in the fourth clock cycle, a first request sent by each of the 0th processing module, the 1st processing module, and the third processing module in the fourth clock cycle.

In other implementations, at least one of the P first requests is sent prior to the N-th clock cycle. In this implementation, there are two cases. In one case, each of the first P first requests is sent prior to the N-th clock cycle. For example, when M is 4, in the implementation corresponding to FIG. 5, the arbitration module obtains, in the fifth clock cycle, a first request sent by each of the first processing module and the third processing module in the third clock cycle. In another case, a part of the P first requests is sent in the N-th clock cycle, and the other part of the P first requests is sent prior to the N-th clock cycle.

In some implementations, the P first requests are sent by the P processing modules respectively in the N-th clock cycle; or at least one of the P first requests is sent prior to the N-th clock cycle. In implementations of the present disclosure, any first request obtained by the arbitration module in the N-th clock cycle is either a first request received by the arbitration module from the processing module in the N-th clock cycle or a first request received by the arbitration module from the processing module prior to the N-th clock cycle. A clock cycle prior to the N-th clock cycle may refer to any one clock cycle from the (N−M−1)-th clock cycle to the (N−1)-th clock cycle.

In implementations of the present disclosure, in the N-th clock cycle, if the arbitration module obtains one first request sent by one of M processing modules, the arbitration module may then determine said one first request as the target request to be sent to the memory module in the N-th clock cycle, that is, the arbitration module authorizes said one first request in the N-th clock cycle, such that said one first request can be sent to the memory module.

At S603, P timeslot values to be respectively allocated to IDs of the P processing modules are determined from a first timeslot table.

The first timeslot table corresponds to the N-th clock cycle, timeslot tables corresponding to different clock cycles may be the same or different, or a timeslot table may be updated continuously along with a count of a clock cycle. A timeslot table corresponding to each clock cycle may include M timeslot values, and the first timeslot table contains M timeslot values arranged in a specific order. In some implementations, the first timeslot table may be stored in the arbitration module, and the M timeslot values may correspond to the IDs of the M processing modules. For example, when the IDs of the M processing modules are 0, 1, 2, and 3 respectively, the M timeslot values also include 0, 1, 2, and 3. The IDs of the M processing modules can identify the M processing modules respectively, and the timeslot table in implementations of the present disclosure can be understood as a clock-cycle table.

The P timeslot values to be respectively allocated to the IDs of the P processing modules are determined from the first timeslot table by determining, from the first timeslot table, timeslot values at locations of the IDs of the P processing modules as the P timeslot values. For example, the first timeslot table is {3, 1, 2, 4}, and if the IDs of the P processing modules are 0 and 3, a timeslot value 3 at the 0th location and a timeslot value 4 at the third location in the first timeslot table are determined as the P timeslot values obtained.

In some implementations, a processing module or an ID of a processing module may correspond to a timeslot value, a unique corresponding timeslot value may be found according to the ID of the processing module, and a unique ID of a processing module may also be found according to a timeslot value. The arbitration module may determine the P timeslot values to be respectively allocated to IDs of the P processing modules from the first timeslot table according to a preset rule. For example, the arbitration module may determine the P timeslot values to be respectively allocated to the IDs of P processing modules according to a mapping relationship between IDs of processing modules and timeslot values. The mapping relationship may be preset, and the mapping relationship may be a list or a mathematical formula. For another example, the IDs of the P processing modules may be the same as the P timeslot values contained in the timeslot table, that is, when the IDs of the P processing modules are 0, 1, 2, and 3, the P timeslot values may be 0, 1, 2, and 3 in any order.

At S605, a target request to be sent to the memory module in the N-th clock cycle is determined among the P first requests, according to a normalized clock-cycle count corresponding to the N-th clock cycle and the P timeslot values.

An ID of a processing module may have a corresponding relationship with a normalized clock-cycle count. In some implementations, the IDs of the M processing module may be equal to normalized counts of M clock cycles, respectively. For example, the normalized counts of the M clock cycles are 0, 1, 2, 3 respectively, and the IDs of the M processing modules are also 0, 1, 2, 3 respectively. In other implementations, the IDs of the M processing modules may be different from the normalized counts of the M clock cycles, respectively, but the IDs of the M processing modules may correspond to the normalized counts of the M clock cycles. For example, a normalized clock-cycle count 0 corresponds to ID "A" of a processing module, and a normalized clock-cycle count 1 corresponds to ID "B" of a processing module.

In implementations of the present disclosure, the IDs of the M processing modules are equal to the normalized counts of the M clock cycles. However, it should be understood that in other implementations, the IDs of the M processing modules may be different from the normalized counts of the M clock cycles, which still belongs to the scope of protection of the present disclosure.

Normalization aims to restrict an actual clock-cycle count to a certain range via processing, and a range defined by normalization in implementations of the present disclosure is integers between 0 and M−1. The normalized clock-cycle count is not the actual clock-cycle count N, and the actual clock-cycle count N is processed and limited to an integer between 0 and M−1.

The normalized clock-cycle count is the same as the value of N modulo M. In implementations of the present disclosure, the normalized clock-cycle count may be obtained according to the actual clock-cycle count N of the clock cycle modulo the number M of processing modules. For example, M=4, N=3, the normalized clock-cycle count=3% 4=3. For another example, M=4, N=12, the normalized clock-cycle count=12% 4=0.

In some implementations, the arbitration module may determine, among the P timeslot values, a target timeslot value closest to the normalized clock-cycle count, and determine a request sent by a processing module corresponding to the target timeslot value as the target request.

In other implementations, the arbitration module may determine, among the P timeslot values, a first timeslot value that is farthest from the normalized clock-cycle count, and determine a request sent by a processing module corresponding to the first timeslot value as the target request.

In some other implementations, the arbitration module may determine, among P timeslot values, a second timeslot value that meets a preset relationship with the normalized clock-cycle count, and determine a request sent by a processing module corresponding to the second timeslot value as the target request.

After S605, in the N-th clock cycle, the memory module may also receive the target request sent by the arbitration module.

In some implementations, when the first request is a read request, the arbitration module may receive, in the (N+3)-th clock cycle, request data sent by the memory module to the processing module that sends the target request, where the request data is data that responds to the read request.

In some implementations, the arbitration module may receive, in or after the (N+4)-th clock cycle, a first request sent to the memory module by the processing module sending the target request.

In the first related art, when none of the IDs of the P processing modules corresponds to the normalized clock-cycle count corresponding to the N-th clock cycle, the arbitration module will not authorize any first request. In the second related art, when none of the IDs of the P processing modules corresponds to the normalized clock-cycle count corresponding to the N-th clock cycle, one first request is randomly authorized among the P requests, and the authorized one first request is the target request sent to the memory module in the N-th clock cycle.

In implementations of the present disclosure, the arbitration module does not randomly determine one first request among P first requests to be authorized. Instead, the P timeslot values respectively corresponding to the IDs of the P processing modules are determined from the first timeslot table, and then the target request sent to the memory module in the N-th clock cycle is determined according to the P timeslot values and the normalized clock-cycle count. In other words, according to the first timeslot table, the IDs of the P processing modules, and the normalized clock-cycle count, a first request is selected among the P first requests to be authorized.

In implementation of the present disclosure, the target request determined by the arbitration module is one first request, which is not limited in implementations of the present disclosure. In other implementations, the target request determined by the arbitration module may be at least two first requests.

In implementations of the present disclosure, according to the normalized clock-cycle count corresponding to the N-th clock cycle and the P timeslot values determined from the first timeslot table, the target request to be sent to the memory module in the N-th clock cycle is determined among the P first requests, such that the target request sent to the memory module in the N-th clock cycle can be determined, thereby avoiding the case where the target request sent to the memory module in the N-th clock cycle is unable to be determined, thus improving an arbitration efficiency of the arbiter. In addition, a certainty that the arbitration module determines the target request among the P first requests is improved, thereby avoiding an uncertainty of a selected target request caused by randomly selecting a target request among the P first requests, and further satisfying arbitration requirements in different situations.

Figure 7:
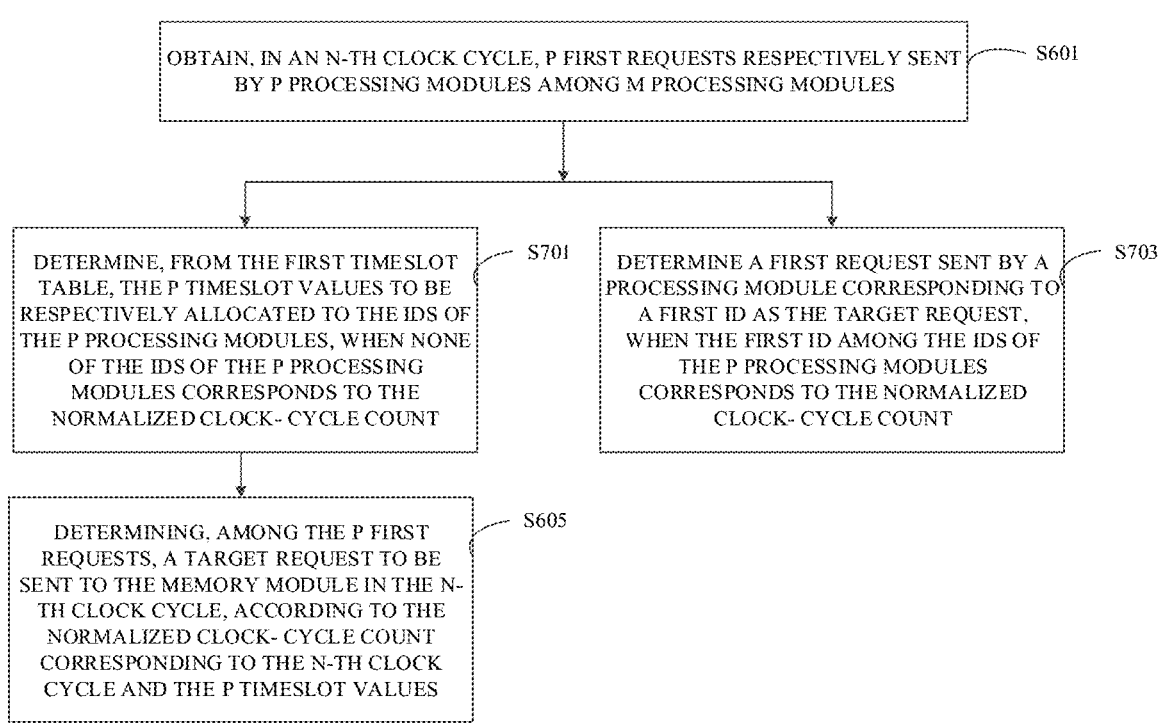
FIG. 7 is a schematic flowchart of another arbitration method provided in implementations of the present disclosure.

FIG. 7 is a schematic flowchart of another arbitration method provided in implementations of the present disclosure. As illustrated in FIG. 7, the method can be applied to an arbitration module. The implementation corresponding to FIG. 7 differs from the implementation corresponding to FIG. 6 in that the implementation corresponding to FIG. 7 further includes the following.

At S701, when none of the IDs of the P processing modules corresponds to the normalized clock-cycle count corresponding to the N-th clock cycle, the P timeslot values to be respectively allocated to the IDs of the P processing modules are determined from the first timeslot table.

None of the IDs of the P processing modules corresponds to the normalized clock-cycle count corresponding to the N-th clock cycle, which may include: none of the IDs of the P processing modules is equal to the normalized clock-cycle count corresponding to the N-th clock cycle.

At S703, when a first ID in the IDs of the P processing modules corresponds to a normalized clock-cycle count, a first request sent by a processing module corresponding to the first ID is determined as the target request.

In some implementations, the normalized clock-cycle count is the same as the value of N modulo M.

The first ID among the IDs of the P processing modules corresponds to the normalized clock-cycle count, which may include that the first ID among the IDs of the P processing modules is equal to the normalized clock-cycle count.

It should be noted that, in the second related art, when the first ID among the IDs of the P processing modules corresponds to the normalized clock-cycle count, and at least one first request among the P first requests is received by the arbitration module prior to the N-th clock cycle, the arbitration module may randomly select one first request from the at least one first request as the target request. It can be obviously seen that, in the second related art, in the N-th clock cycle, the arbitration module authorizes the first request received prior to the N-th clock cycle, which will result in the pipeline stall of the first request received in the N-th clock cycle by the arbitration module.

However, in implementations of the present disclosure, it is not concerned whether the first request is received in the N-th clock cycle or is received prior to the N-th clock cycle, as long as the arbitration module determines that the obtained IDs of the P processing modules includes the first ID corresponding to the normalized clock-cycle count, the first request sent by the processing module corresponding to the first ID is determined as the target request.

In implementations of the present disclosure, the arbitration module always authorizes the first request corresponding to the first ID which is equal to the normalized clock-cycle count, thereby avoiding disturbing a current alignment access to the greatest extent.

Figure 8:
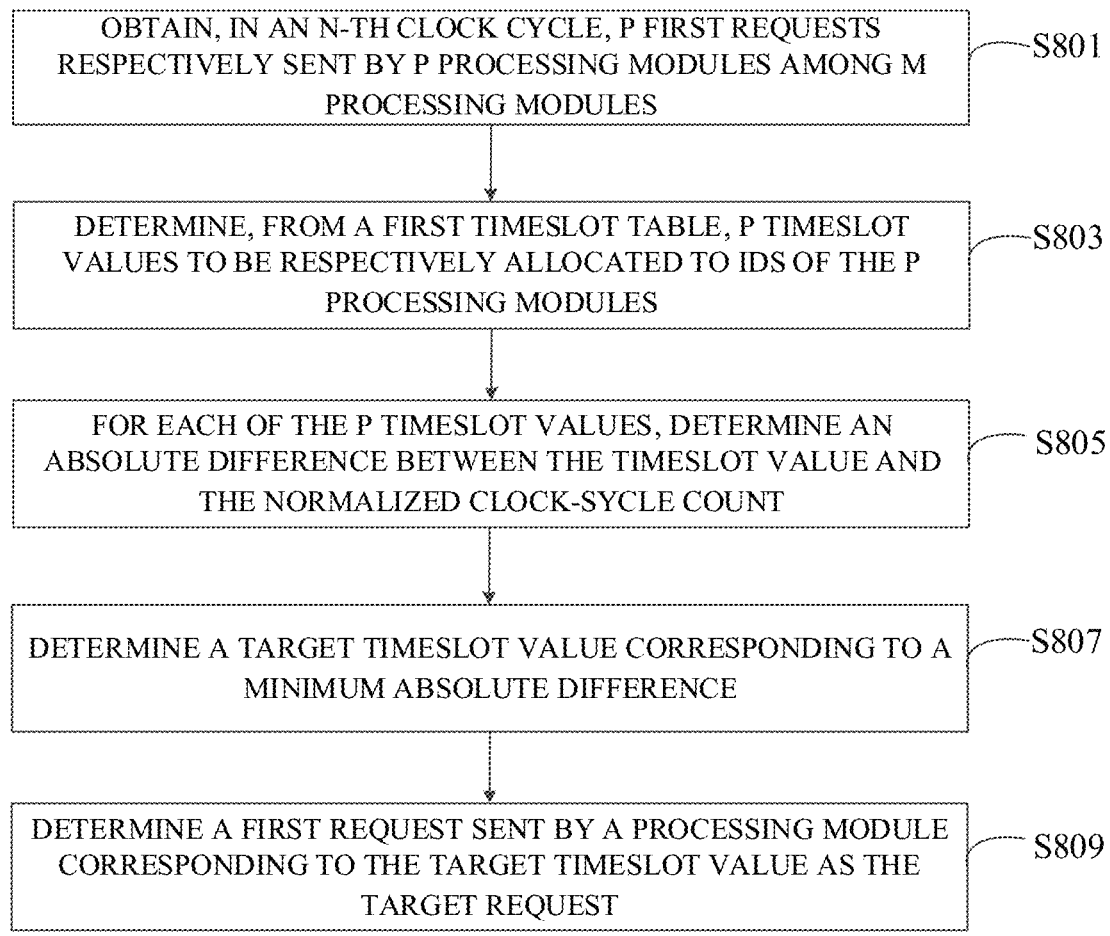
FIG. 8 is a schematic flowchart of yet another arbitration method provided in implementations of the present disclosure.

FIG. 8 is a schematic flowchart of another arbitration method provided in implementations of the present disclosure. As illustrated in FIG. 8, the method can be applied to an arbitration module, and the method includes the following.

At S801, P first requests respectively sent by P processing modules among M processing modules are obtained in an N-th clock cycle.

At S803, P timeslot values to be respectively allocated to IDs of the P processing modules are determined from the first timeslot table.

At S805, for each of the P timeslot values, an absolute difference between the timeslot value and a normalized clock-cycle count is determined.

At S807, a target timeslot value corresponding to a minimum absolute value is determined.

In some implementations, when there are two absolute differences, the arbitration module may determine the target timeslot value corresponding to a smaller one of two absolute differences or a greater one of two absolute differences.

At S809, a first request sent by a processing module corresponding to the target timeslot value is determined as the target request.

In implementations of the present disclosure, the arbitration module selects, among the P timeslot values, the target timeslot value closest to the normalized clock-cycle count, and determines the first request sent by the processing module corresponding to the target timeslot value as the target request. However, in other implementations, the arbitration module may select, among the P timeslot values, a timeslot value that is farthest from the normalized clock-cycle count and determine a first request corresponding to said timeslot value as the target request. In an implementation, a first timeslot value corresponding to the maximum absolute difference may be determined, and a first request sent by a processing module corresponding to the first timeslot value is determined as the target request.

In implementations of the present disclosure, when none of the IDs of the P processing modules corresponds to the normalized clock-cycle count corresponding to the N-th clock cycle, a method for the arbitration module to determine the target request among the P first requests is provided, so that a certainty when the arbitration module determines one first request among the P first requests can be improved.

Figure 9:
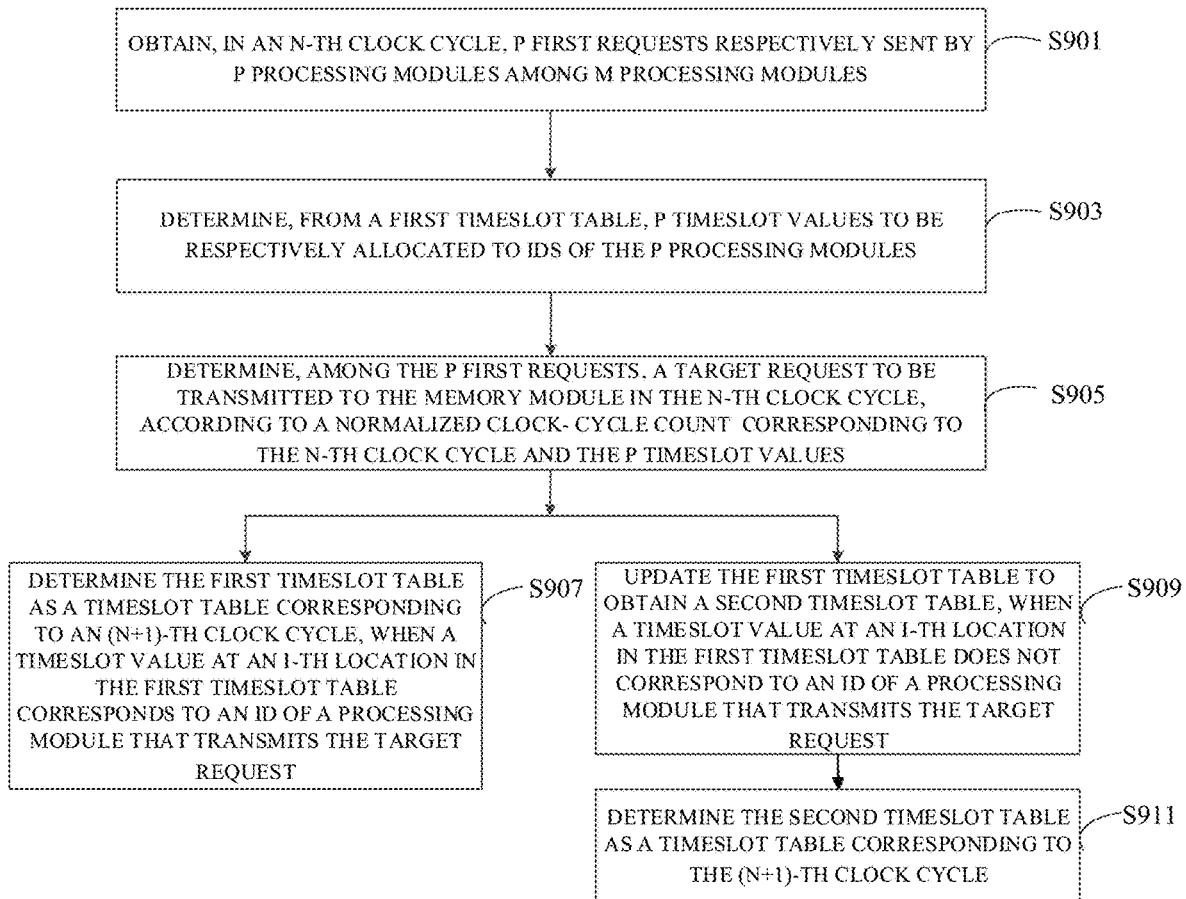
FIG. 9 is a schematic flowchart of yet another arbitration method provided in implementations of the present disclosure.

FIG. 9 is a schematic flowchart of yet another arbitration method provided in implementations of the present disclosure. As illustrated in FIG. 9, the method can be applied to an arbitration module, and the method includes the following.

At S901, P first requests respectively sent by P processing modules among M processing modules are obtained in the N-th clock cycle.

At S903, P timeslot values to be respectively allocated to IDs of the P processing modules are determined from the first timeslot table.

At S905, a target request to be sent to the memory module in the N-th clock cycle is determined according to a normalized clock-cycle count corresponding to the N-th clock cycle and the P timeslot values.

At S907, when a timeslot value at the i-th location in the first timeslot table corresponds to an ID of a processing module that sends the target request, the first timeslot table is determined as a timeslot table corresponding to the (N+1)-th clock cycle.

i is equal to the normalized clock-cycle count, that is, i is equal to N modulo M.

The timeslot value at the i-th location corresponds to the ID of the processing module that sends the target request, which may include: the timeslot value at the i-th location is the same as the ID of the processing module that sends the target request.

In some implementations, timeslot values at locations before the i-th location in the first timeslot table respectively correspond to authorized first requests sent by processing modules.

At S909, when the timeslot value at the i-th location in the first timeslot table does not correspond to the ID of the processing module that sends the target request, the first timeslot table is updated to obtain a second timeslot table.

The timeslot value at the i-th location does not correspond to the ID of the processing module that sends the target request, which may include: the timeslot value at the i-th location is different from the ID of the processing module that sends the target request.

The arbitration module may update the first timeslot table in the N-th clock cycle to obtain the second timeslot table.

The arbitration module may update the first timeslot table as follows. The arbitration module may determine, in the first timeslot table, a j-th location where a timeslot value corresponding to the ID of the processing module that sends the target request is located. The arbitration module may interchange the timeslot value at the i-th location with the timeslot value at the j-th location in the first timeslot table, to obtain the second timeslot table.

The j-th location of the timeslot value corresponding to the ID of the processing module that sends the target request may include the j-th location of the timeslot value that is the same as the ID of the processing module that sends the target request.

At S911, the second timeslot table is determined as a timeslot table corresponding to the (N+1)-th clock cycle.

Table 1 is an example of a method for updating a timeslot table provided in implementations of the present disclosure, and table 1 is illustrated in the following.

TABLE 1

| Clock cycle (N) | ID of a processing module that sends a first request | A timeslot table corresponding to the N-th clock cycle | ID of a processing module that sends a first request | A timeslot table corresponding to the (N + 1)-th clock cycle |
|---|---|---|---|---|
| 0 | {0, 3} | [0, 1, 2, 3] | 0 | [0, 1, 2, 3] |
| 1 | {2, 3} | [0, 1, 2, 3] | 2 | [0, 2, 1, 3] |
| 2 | {3} | [0, 2, 1, 3] | 3 | [0, 2, 3, 1] |
| 3 | {1} | [0, 2, 3, 1] | 1 | [0, 2, 3, 1] |
| 4 | { } | [0, 2, 3, 1] | NA | [0, 2, 3, 1] |

It can be seen from table 1 that the 0th clock cycle corresponds to a normalized clock-cycle count 0, a timeslot table corresponding to the 0th clock cycle is [0, 1, 2, 3], i=N % M=0%4=0, and the ID of the processing module that sends the first request is {0,3}. The arbitration module determines, from the timeslot table [0, 1, 2, 3], that timeslot values to be respectively allocated to the IDs {0, 3} of processing modules are a timeslot value 0 at the 0th location and a timeslot value 3 at the third location. Because the timeslot value 0 at the 0th location is closest to the normalized clock-cycle count 0, the ID 0 of a processing module corresponding to the timeslot value 0 is determined as the ID of the processing module that sends the target request. The timeslot value 0 at the (i=0)-th location is the same as the ID 0 of the processing module that sends the target request, and then the timeslot table corresponding to the 0th clock cycle is determined as a timeslot table corresponding to the first clock cycle.

The first clock cycle corresponds to a normalized clock-cycle count 1, a timeslot table corresponding to the first clock cycle is [0, 1, 2, 3], i=N % M=1% 4=1, and IDs of processing modules that each sends the first request is {2, 3}. The arbitration module determines, from the timeslot table [0, 1, 2, 3], that timeslot values to be respectively allocated to the IDs {2, 3} of the processing modules are a timeslot value 2 at the second location and a timeslot value 3 at the third location. Because the timeslot value 2 at the second location is closest to the normalized clock-cycle count 1, the ID 2 of the processing module corresponding to the timeslot value 2 is determined as the ID of the processing module that sends the target request. The timeslot value 1 at the (i=1)-th location is different from the ID 2 of the processing module that sends the target request, the timeslot value 1 at the i-th location in [0, 1, 2, 3] is interchanged with the timeslot value 2 at the second location in [0, 1, 2, 3], to obtain a timeslot table [0, 2, 1, 3].

The second clock cycle corresponds to a normalized clock-cycle count 2, a timeslot table corresponding to the second clock cycle is [0, 2, 1, 3], i=N % M=2%4=2, and the ID of the processing module that sends the first request is {3}. The arbitration module determines, from the timeslot table [0, 2, 1, 3], that a timeslot value allocated to the ID {3} of the processing module is the timeslot value 3 at the third location. Because there exists only one request, the ID 3 of the processing module corresponding to the timeslot value 3 is determined as the ID of the processing module that sends the target request. The timeslot value 1 at the (i=2)-th location is different from the ID 3 of the processing module that sends the target request, the timeslot value 1 at the second location in [0, 2, 1, 3] is interchanged with the timeslot value 3 at the third location, to obtain a timeslot table [0, 2, 3, 1].

The third clock cycle corresponds to a normalized clock-cycle count 3, a timeslot table corresponding to the third clock cycle is [0, 2, 3, 1], i=N % M=3%4=3, and the ID of the processing module that sends the first request is {1}. The arbitration module determines, from the timeslot table [0, 2, 3, 1], that a timeslot value allocated to the ID {1} of the processing module is the timeslot value 2 at the first location. Because there exists only one request, the ID 1 of the processing module corresponding to the timeslot 2 is determined as the ID of the processing module that sends the target request. The timeslot 1 at the (i=3)-th location is the same as the ID 1 of the processing module that sends the target request, and the timeslot table corresponding to the second clock cycle is determined as the timeslot table corresponding to the third clock cycle.

The fourth clock cycle corresponds to a normalized clock-cycle count 0, a timeslot table corresponding to the fourth clock cycle is [0, 2, 3, 1], the ID of the processing module that sends the first request is 0, a determined ID of the processing module that sends the target request is NA, and the timeslot table corresponding to the fourth clock cycle is determined as the timeslot table corresponding to the fifth clock cycle.

In implementations of the present disclosure, since timeslot tables corresponding to different clock cycles are provided, a first request authorized in the N-th clock cycle can be recorded according to the timeslot table, and an appropriate first request authorized in the (N+1)-th clock cycle can be determined according to a location authorized in the N-th clock cycle. For example, in the third clock cycle in Table 1, the ID 3 of the processing module authorized in the second clock cycle can be determined according to the timeslot table.

In this way, when there are at least two first requests in a certain clock cycle, the arbitration module can select timeslot values corresponding to the IDs of the processing modules, and a first request corresponding to an ID of a processing module that is closet to the normalized clock-cycle count is determined as a target request. In this way, one first request can be ensured to be authorized in a current clock cycle, and additionally stall time generated by the other unauthorized first requests is the shortest.

Figure 10:
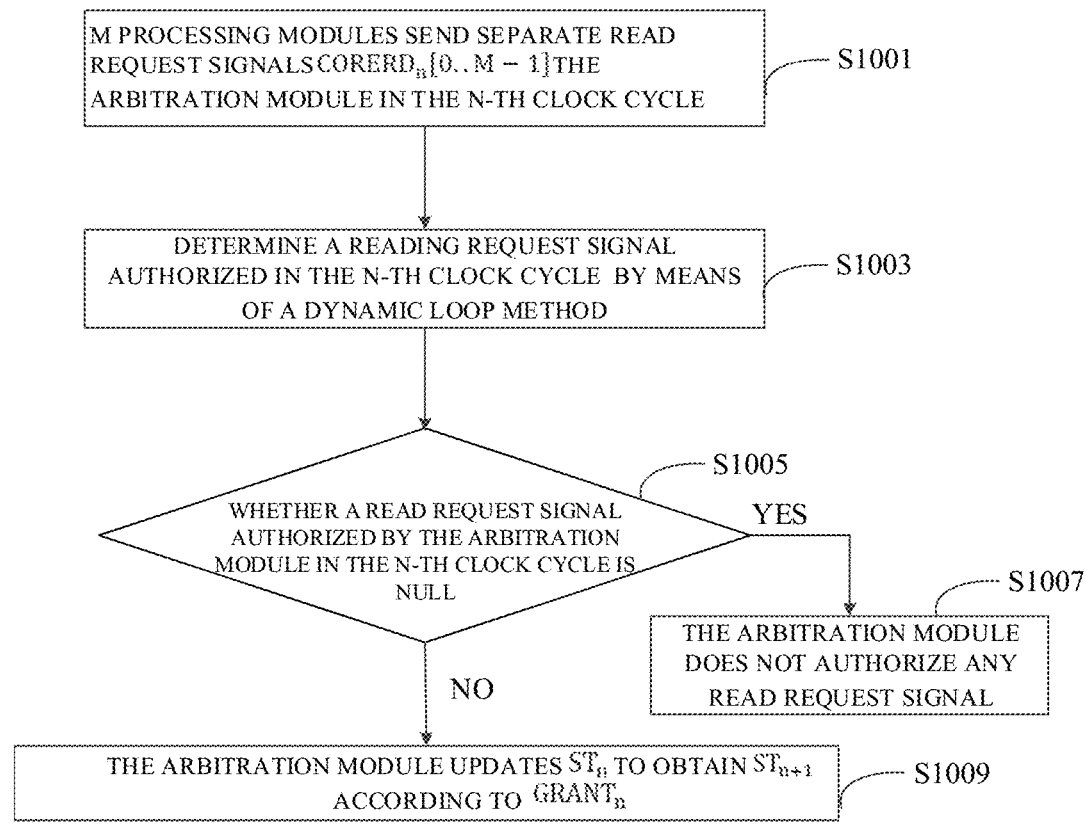
FIG. 10 is a schematic flowchart of an arbitration method according to other implementations of the present disclosure.

FIG. 10 is a schematic flowchart of an arbitration method according to other implementations of the present disclosure. As illustrated in FIG. 10, the method can be applied to an arbitration module. The arbitration method in implementation of the present disclosure can be a dynamic loop (or dynamic round-robin) arbitration method. In the dynamic loop arbitration method, a first request authorized in the N-th clock cycle is determined according to a timeslot table. Even if a first request sent by a processing module in the current clock cycle does not correspond to the current clock cycle, said first request can still be authorized or acknowledged in the current clock cycle, and the cost of realignment due to stalls of other first requests can be minimized. The method includes the following.

At S1001, M processing modules send separate read request signals $CORERD_n[0 \ldots M-1]$ to the arbitration module in the n-th clock cycle.

$CORERD_n[0]$ represents that a read request signal sent by the 0th processing module to the arbitration module in the n-th clock cycle. $CORERD_n[0]=0$, which represents that the 0th processing module does not send any read request signal to the arbitration module in the n-th clock cycle; and $CORERD_n[0]=1$, which represents that the 0th processing module sends a read request signal to the arbitration module in the n-th clock cycle. $CORERD_n[M-1]$ represents that a read request signal sent by the (M−1)-th processing module to the arbitration module in the n-th clock cycle.

At S1003, a reading request signal authorized in the N-th clock cycle is determined by means of a dynamic loop method.

The read request signal can be authorized by means of a dynamic loop method according to formula (3).

$$GRANT_n = \begin{cases} NULL & \text{if } CORERD_n[0 \ldots M-1] == 0 \\ \text{minimal } (\{K\}_n, ST[0 \ldots M-1]_n) & \text{otherwise} \end{cases} \quad (3)$$

M represents the number of processing modules accessing the memory module through the arbitration module, n represents a count of a current clock cycle count, $GRANT_n$ represents the ID of the processing module authorized in the n-th clock cycle, and $CORERD_n[k]$ is a read request signal sent by the k-th processing module in the n-th clock cycle. $CORERD_n[0 \ldots M-1]==0$, which represents a processing module whose ID is 0 to a processing module whose ID is M−1 do not send any first request to the VMA in the n-th clock cycle. $\{K\}_n$ represents a set of IDs of processing modules in the n-th clock cycle with CORERD==1, $ST[0 \ldots M-1]_n$ represents a timeslot table with M items, and $ST[k]_n$ represents a reserved ID of a processing module that sends the read request signal in the n-th clock cycle. The function minimal($\{K\}_n$, $ST[0 \ldots M-1]_n$) is used to select an ID of a pending processing module with CORERD==1, a timeslot value indicated by the timeslot table $ST[0 \ldots M-1]_n$ is a timeslot value closes to n modulo M.

At S1005, whether a read request signal authorized by the arbitration module in the N-th clock cycle is NULL is determined.

If the read request signal authorized by the arbitration module in the N-th clock cycle is NULL, proceed to operations at S1007, and if the read request signal authorized by the arbitration module in the N-th clock cycle is not NULL, proceed to operations at S1009.

At S1007, the arbitration module does not authorize any read request signal.

At S1009, the arbitration module updates $ST_n$ to obtain $ST_{n+1}$ according to $GRANT_n$.

$ST_n$ can be updated to obtain $ST_{n+1}$ according to formula (4), (5) and (6).

$$slot = ST[GRANT_n]_n \quad (4)$$

$$ST[GRANT_n]_{n+1} = ST[0 \ldots M-1]_{n, n \% m} \quad (5)$$

$$ST[CoreId_{n \% M}]_{n+1} = slot \quad (6)$$

$ST[GRANT_n]_n$ represents a timeslot value at a location $GRANT_n$ authorized in the n-th clock cycle, $ST[GRANT_n]_{n+1}$ represents a timeslot value at a location $GRANT_n$ authorized in the (n+1)-th clock cycle, $ST[0 \ldots M-1]_{n, n \% m}$ represents a timeslot value at a location n % m in the timeslot table $ST[0 \ldots M-1]_n$, $CoreId_{n \% m}$ equals to n % m, and $ST[CoreId_{n \% M}]_{n+1}$ represents a timeslot value at a location $CoreId_{n \% M}$ in the (N+1)-th clock cycle.

For example, in the first clock cycle in Table 1, $ST[0 \ldots M-1]_n = [0, 1, 2, 3]$, slot=2, $ST[2]_{n+1}=1$, $ST[1]_{n+1}=slot=2$, and thus $ST[0 \ldots M-1]_{n+1} = [0, 2, 1, 3]$.

For example, in the second clock cycle in Table 1, $ST[0 \ldots M-1]_n = [0, 2, 1, 3]$, slot=3, $ST[3]_{n+1}=1$, $ST[2]_{n+1}=slot=3$, and thus $ST[0 \ldots M-1]_{n+1} = [0, 2, 3, 1]$.

In order to illustrate the advantages of the dynamic loop arbitration method in implementations of the present disclosure compared with the first related technology (a round-robin arbitration method) and the second related technology (a fair FIFO arbitration method), simulation is performed in a simulation manner.

Table 2 illustrates parameter setting during simulation provided in implementations of the present disclosure, and table 2 is illustrated as following.

TABLE 2

| Parameters | Value | Description |
| --- | --- | --- |
| Number of processing units (M) | 4 | The number of processing units |
| Simulation cycle (SIMU_CYCLE) | 1000000 | Total simulation cycle |
| Access interval | 4 | A clock cycle between a processing unit accessing two adjacent memory units |
| Access burst | 4 | Number of consecutive accesses |
| Access range | 40 | Maximum clock cycle between access bursts |
| Stall range | 20~200 | Maximum clock cycle between two external stalls |
| Stall cycle | 1 | Clock cycle in which a processing unit is externally stalled |

In table 2, the number of processing units may be the number of cores in one or more VDSP systems, and the total simulation cycle may be a simulation clock cycle. The two adjacent memory units may be the x-th VM Block and the (x+1)-th VM Block.

Figure 11:
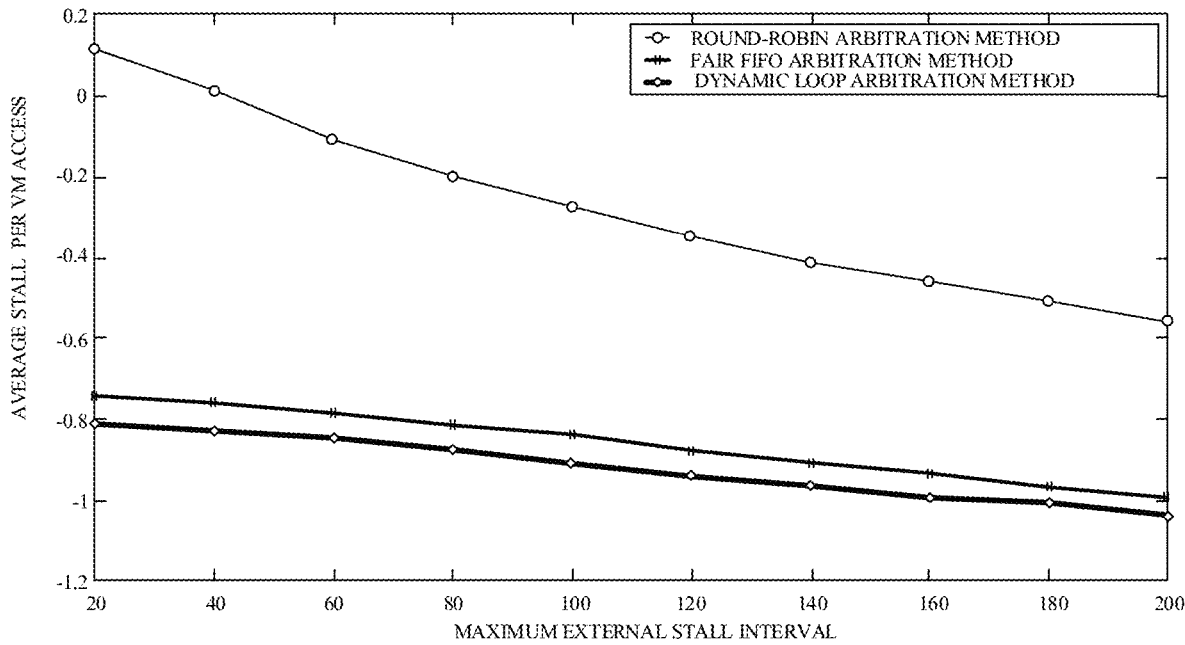
FIG. 11 is a schematic diagram of simulation results of different types of arbitration methods provided in implementations of the present disclosure.

FIG. 11 is a schematic diagram of simulation results of different types of arbitration methods provided in implementations of the present disclosure. As illustrated in FIG. 11, in the schematic diagram of simulation results, the x-axis represents a maximum external stall interval in units of clock cycle, and the y-axis represents an average stall per VM access in units of $\log_{10}(cycle)$. The average stall may be the number of times of stall.

The simulation results show that the number of times of stall of the dynamic loop arbitration method is much less than that of the round-robin arbitration method, and is also less than that of the fair FIFO arbitration method.

The technician found that when external stall frequently occurs (for example, for a maximum of 20 clocks, the external stall occurs once every 10 cycles), the number of times of stall of the fair FIFO arbitration method is 0.179, while the number of times of stall of the dynamic loop arbitration method is 0.155, which is reduced by 15.5%. When external stall rarely occurs (for example, for a maximum of 200 clocks, the external stall occurs once every 100 cycles), the number of times of stall of the fair FIFO arbitration method is 1.000, while the number of times of stall of the dynamic loop arbitration method is 0.911, which is reduced by 9.8%.

In implementations of the present disclosure, in the dynamic loop arbitration method, the average number of times of stall of each processing unit is reduced, and low-delay access of the processing unit to the memory unit is achieved, thereby eliminating conflicts. In implementations of the present disclosure, timeslot tables corresponding to different clock cycles are introduced, so that an unaligned access (or an unauthorized access) can be quickly determined, and additionally damage to a current aligned access can also be minimized. As illustrated in FIG. 5, if the arbitration unit does not receive signal Core2 RD in the seventh clock cycle, but receives signal Core2 RD in the sixth clock cycle, signal CORE 3 RD is still authorized in the sixth clock cycle according to the fair FIFO arbitration method, which will cause continues stall of signal CORE 2 RD. However, according to the dynamic loop arbitration method in implementations of the present disclosure, signal Core2 RD is authorized in the sixth clock cycle, which will not cause stall of signal Core2 RD, and will not damage current aligned access.

According to foregoing implementations, a data processing apparatus is provided in implementations of the present disclosure. Various units included in the arbitration apparatus and various modules included in the various units can be implemented by logic circuits in the data processing apparatus.

Figure 12:
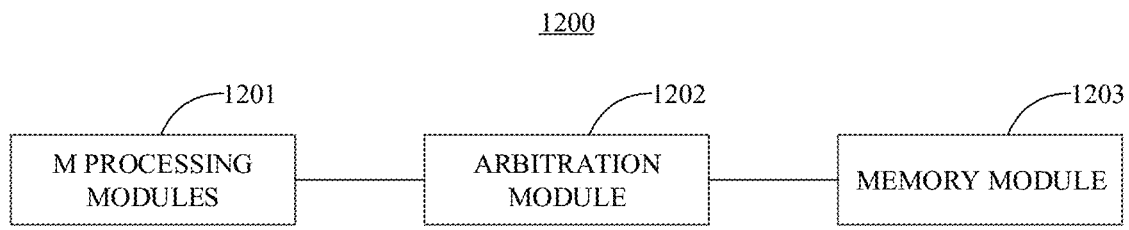
FIG. 12 is a schematic structural diagram of another data processing apparatus provided in other implementations of the present disclosure.

FIG. 12 is a schematic structural diagram of another data processing apparatus provided in implementations of the present disclosure. As illustrated in FIG. 12, the data processing apparatus includes M processing modules 1201, an arbitration module 1202, a memory module 1203.

Each of the M processing modules 1201 is configured to send a first request to a memory module via an arbitration module.

The arbitration module 1202 is configured to obtain, in the N-th clock cycle, P first requests respectively sent by P processing modules among M processing modules; determine, from a first timeslot table, P timeslot values to be respectively allocated to IDs of the P processing modules; and determine, among the P first requests, a target request to be sent to the memory module in the N-th clock cycle, according to a normalized clock-cycle count corresponding to the N-th clock cycle and the P timeslot values; where M is an integer greater than or equal to P, N is an integer greater than or equal to zero, and P is an integer greater than or equal to two.

The memory module 1203 is configured to receive, in the N-th clock cycle, the target request sent by the arbitration module.

In some implementations, the normalized clock-cycle count is the same as a value of N modulo M.

In some implementations, the first timeslot table corresponds to the N-th clock cycle, and the first timeslot table contains M timeslot values arranged in a specific order. The arbitration module 1202 is further configured to determine, from the first timeslot table, timeslot values at locations of the IDs of the P processing modules as the P timeslot values.

In some implementations, the arbitration module 1202 is further configured to: for each of the P timeslot values, determine an absolute difference between the timeslot value and the normalized clock-cycle count; determine a target timeslot value corresponding to a minimum absolute difference; and determine a first request sent by a processing module corresponding to the target timeslot value as the target request.

In some implementations, the arbitration module 1202 is further configured to determine the first timeslot table as a timeslot table corresponding to an (N+1)-th clock cycle, when a timeslot value at an i-th location in the first timeslot table corresponds to an ID of a processing module that sends the target request; where i is equal to the normalized clock-cycle count.

In some implementations, the arbitration module 1202 is further configured to update the first timeslot table to obtain a second timeslot table, when a timeslot value at an i-th location in the first timeslot table does not correspond to an ID of a processing module that sends the target request; where i is equal to the normalized clock-cycle count; and determine the second timeslot table as a timeslot table corresponding to the (N+1)-th clock cycle.

In some implementations, the arbitration module 1202 is further configured to determine, in the first timeslot table, a j-th location where a timeslot value corresponding to the ID of the processing module that sends the target request is located; and obtain the second timeslot table by interchanging the timeslot value at the i-th location with a timeslot value at the j-th location in the first timeslot table.

In some implementations, the arbitration module 1202 is further configured to determine, from the first timeslot table, the P timeslot values to be respectively allocated to the IDs of the P processing modules, when none of the IDs of the P processing modules corresponds to the normalized clock-cycle count.

In some implementations, the arbitration module 1202 is further configured to determine a first request sent by a processing module corresponding to a first ID as the target request, when the first ID among the IDs of the P processing modules corresponds to the normalized clock-cycle count.

In some implementations, the P first requests are sent by the P processing modules respectively in the N-th clock cycle; or, at least one of the P first requests is sent prior to the N-th clock cycle.

In some implementations, the M processing modules each includes one of the following: a digital signal processing (DSP) core, a micro control unit (MCU), a field programmable gate array (FPGA), advanced reduced instruction set computer (RDSC) machines (ARM), a central processing unit (CPU), and an application specific integrated circuit (ASIC). The memory module includes one of the following: a memory block, a read-only memory (ROM), a random access memory (RAM), a dynamic random access memory (DRAM), a static random access memory (SRAM), a synchronous dynamic random access memory (SDRAM), and a double data rate (DDR) SDRAM.

In some implementations, the first request includes a read request for reading data from the memory module, or a write request for writing data into the memory module.

In some implementations, when the first request is the read request, the arbitration module receives, in an (N+3)-th clock cycle, request data sent by the memory module to a processing module that sends the target request.

In some implementations, the arbitration module receives, in an (N+4)-th clock cycle or after the (N+4)-th clock cycle, a first request sent to the memory module by a processing module that sends the target request.

In some implementations, the data processing device may have Q memory blocks, and each of the Q memory blocks may be the memory module in foregoing implementations.

In some implementations, the arbitration module may further include a first interface configured to be connected with an external master.

In some implementations, the arbitration module may further include a second interface configured to be connected with an external slave.

Above apparatus implementations are similar to above method implementations in descriptions and beneficial effects. For technical details not disclosed in the apparatus implementations of the present disclosure, reference can be made to descriptions of the method implementations of the present disclosure for understanding.

It should be noted that, in implementations of the present disclosure, if the arbitration method is implemented in the form of software function modules and sold or used as an independent product, the software function modules can be stored in a computer-readable storage medium. Based on such understanding, the essence of technical solutions of implementations of the present disclosure or the part that contributes to the related art can be implemented in the form of software products. The computer software products are stored in a storage medium and include several instructions to make an arbitration device execute all or part of the method in various implementations of the present disclosure. The storage medium includes a U disk, a mobile hard disk, a read only memory (ROM), a magnetic disk, an optical disk, and other media capable of storing program codes. Therefore, implementations of the present disclosure are not limited to any specific combination of hardware and software.

According to foregoing implementations, an arbitration apparatus is provided in implementations of the present disclosure. Various units included in the arbitration apparatus and various modules included in the various units can be implemented by logic circuits in the data processing apparatus.

Figure 13:
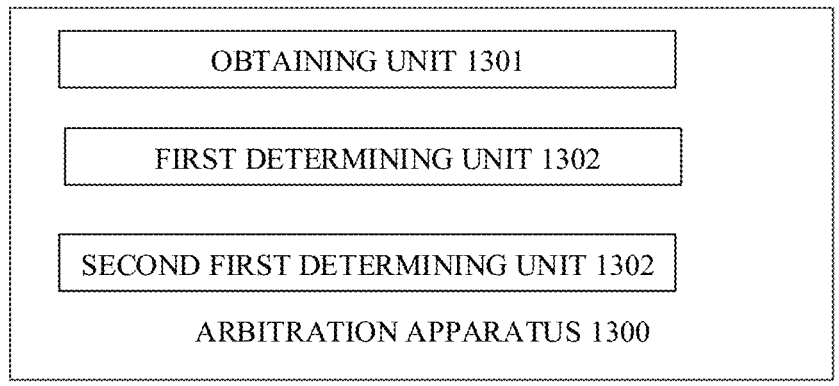
FIG. 13 is a schematic structural diagram of an arbitration apparatus provided in implementations of the present disclosure.

FIG. 13 is a schematic structural diagram of an arbitration apparatus provided in implementations of the present disclosure. As illustrated in FIG. 13, the arbitration apparatus includes an obtaining unit 1301 and a first determining unit 1302.

The obtaining unit 1301 is configured to obtain, in the N-th clock cycle, P first requests respectively sent by P processing modules among M processing modules, where the M processing modules are each configured to send a first request to a memory module via an arbitration module, M is an integer greater than or equal to P, N is an integer greater than or equal to zero, and P is an integer greater than or equal to two;

The first determining unit 1302 is configured to determine, from a first timeslot table, P timeslot values to be respectively allocated to IDs of the P processing modules.

The first determining unit 1302 is further configured to determine, among the P first requests, a target request to be sent to the memory module in the N-th clock cycle, according to a normalized clock-cycle count corresponding to the N-th clock cycle and the P timeslot values.

In some implementations, the normalized clock-cycle count is the same as a value of N modulo M.

In some implementations, the first timeslot table corresponds to the N-th clock cycle, and the first timeslot table contains M timeslot values arranged in a specific order. The first determining unit 1302 is further configured to determine, from the first timeslot table, timeslot values at locations of the IDs of the P processing modules as the P timeslot values.

In some implementations, the first determining unit 1302 is further configured to: for each of the P timeslot values, determine an absolute difference between the timeslot value and the normalized clock-cycle count; determine a target timeslot value corresponding to a minimum absolute difference; and determine a first request sent by a processing module corresponding to the target timeslot value as the target request.

In some implementations, the arbitration apparatus 1300 further includes a second determining unit 1303. The second determining unit 1303 is further configured to determine the first timeslot table as a timeslot table corresponding to an (N+1)-th clock cycle, when a timeslot value at an i-th location in the first timeslot table corresponds to an ID of a processing module that sends the target request; where i is equal to the normalized clock-cycle count.

In some implementations, the second determining unit 1303 is further configured to update the first timeslot table to obtain a second timeslot table, when a timeslot value at an i-th location in the first timeslot table does not correspond to an ID of a processing module that sends the target request; where i is equal to the normalized clock-cycle count; and determine the second timeslot table as a timeslot table corresponding to the (N+1)-th clock cycle.

In some implementations, the second determining unit 1303 is further configured to determine, in the first timeslot table, a j-th location where a timeslot value corresponding to the ID of the processing module that sends the target request is located; and obtain the second timeslot table by interchanging the timeslot value at the i-th location with a timeslot value at the j-th location in the first timeslot table.

In some implementations, the first determining unit 1302 is further configured to determine, from the first timeslot table, the P timeslot values to be respectively allocated to the IDs of the P processing modules, when none of the IDs of the P processing modules corresponds to the normalized clock-cycle count.

In some implementations, the first determining unit 1302 is further configured to determine a first request sent by a processing module corresponding to a first ID as the target request, when the first ID among the IDs of the P processing modules corresponds to the normalized clock-cycle count.

In some implementations, the P first requests are sent by the P processing modules respectively in the N-th clock cycle; or, at least one of the P first requests is sent prior to the N-th clock cycle.

In some implementations, the M processing modules each includes one of the following: a digital signal processing (DSP) core, a micro control unit (MCU), a field programmable gate array (FPGA), advanced reduced instruction set computer (RDSC) machines (ARM), a central processing unit (CPU), and an application specific integrated circuit (ASIC). The memory module includes one of the following: a memory block, a read-only memory (ROM), a random access memory (RAM), a dynamic random access memory (DRAM), a static random access memory (SRAM), a synchronous dynamic random access memory (SDRAM), and a double data rate (DDR) SDRAM.

In some implementations, the first request includes a read request for reading data from the memory module, or a write request for writing data into the memory module.

In some implementations, when the first request is the read request, the arbitration module receives, in an (N+3)-th clock cycle, request data sent by the memory module to a processing module that sends the target request.

In some implementations, the arbitration module receives, in an (N+4)-th clock cycle or after the (N+4)-th clock cycle, a first request sent to the memory module by a processing module that sends the target request.

Figure 14:
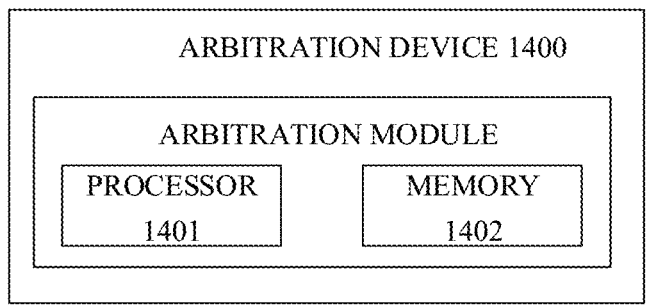
FIG. 14 is a schematic diagram of a hardware entity of an arbitration device provided in implementations of the present disclosure.

FIG. 14 is a schematic diagram of a hardware entity of an arbitration device provided in implementations of the present disclosure. As illustrated in FIG. 14, the arbitration device 1400 includes an arbitration module. The arbitration device includes a processor 1401 and a memory 1402. The memory 1402 stores a computer program capable of running on the processor 1401. The processor 1401 executes the computer program to implement operations of the method according to any one of foregoing implementations.

The memory 1402 stores the computer program that can run on the processor, and the memory 1402 is configured to store an instruction and an application that can be executed by the processor 1401, buffer data (for example, image data, audio data, voice communication data, and video communication data) to be processed or already processed by the processor 1401 and modules in the arbitration device 14. The memory 1402 can be implemented as a flash or a random access memory (RAM).

The processor 1401 executes the computer program to implement operations of the method according to any one of foregoing implementations. The processor 1401 generally controls overall operation of the arbitration device 1400.

In some implementations, the arbitration device includes one of: a modulator, a demodulator, or a modem. The modem may be an integration of a modulator and a demodulator.

The arbitration device may refer to a terminal, and the terminal may include a server, a mobile phone, a tablet computer, a notebook computer, a palmtop computer, a personal digital assistant, a portable media player, an intelligent sound box, a navigation apparatus, a display device, a wearable device such as a smart wristband, a virtual reality (VR) device, an augmented reality (AR) device, a pedometer, a locator, a tracker, a digital TV, or a desktop computer, etc.

A computer storage medium is provided in implementations of the present disclosure. The computer storage medium stores one or more programs, the one or more programs can be executed by one or more processors to implement operations in any one of the methods mentioned above.

A computer program product is provided in implementations of the present disclosure. The computer program product includes a computer storage medium. The computer storage medium stores computer program codes. The computer program codes include instructions that can be executed by at least one processor. The instructions, when executed by the at least one processor, implement operations of a method executed by the arbitration device in foregoing methods.

In some implementations, the computer program product may be applied to the arbitration device in implementations of the present disclosure, and computer program instructions enable a computer to execute corresponding processes implemented by the arbitration device in various methods in implementations of the present disclosure. For the sake of brevity, details are not described herein again.

Figure 15:
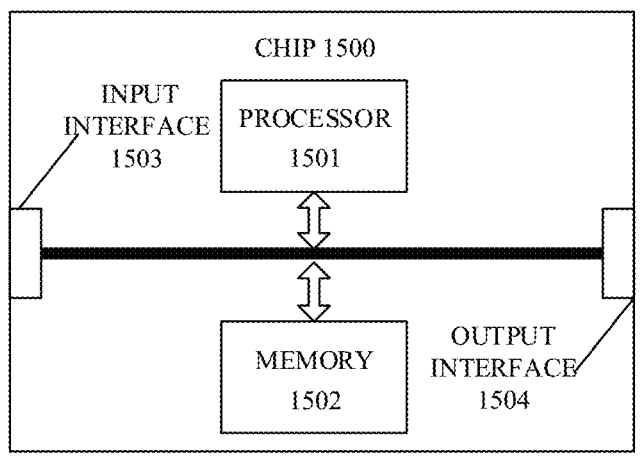
FIG. 15 is a schematic structural diagram of a chip provided in implementations of the present disclosure.

FIG. 15 is a schematic structural diagram of a chip provided in implementations of the present disclosure. The chip 1500 as illustrated in FIG. 15 includes a processor 1501. The processor 1501 may invoke and run a computer program from a memory, so as to implement operations of a method executed by the arbitration device provided in implementations of the present disclosure.

In some implementations, as illustrated in FIG. 15, the chip 1500 can further include a memory 1502. The processor 1501 may invoke and run the computer program from the memory 1502, so as to implement operations of a method executed by the arbitration device in implementations of the present disclosure.

The memory 1502 may be a separate component independent of the processor 1501, and may also be integrated in the processor 1501.

In some implementations, the chip 1500 can further include an input interface 1503. The processor 1501 can control the input interface 1503 to communicate with another device or chip, and specifically, the processor 1501 can control to obtain, through the input interface 1503, information or data sent by another device or chip.

In some implementations, the chip 1500 can further include an output interface 1504. The processor 1501 may control the output interface 1504 to communicate with another device or chip, and specifically, the processor 1501 may control to output, through the output interface 1504, information or data to another device or chip.

In some implementations, the chip 1500 may be applied to the arbitration device in implementations of the present disclosure, and the chip 1500 may implement corresponding processes implemented by the arbitration device in the methods in implementations of the present disclosure. For the sake of brevity, details are not described herein again. The chip 1500 may be a chip in the arbitration device.

It should be understood that the chip 1500 mentioned in implementations of the present disclosure may also be referred to as a system-on-chip or the like.

At least one of the processing module, the arbitration module, the processor, or the external master in implementations of the present disclosure, may include at least one of: a digital signal processing (DSP) core, a micro controller unit (MCU), a field programmable gate array (FPGA), advanced RISC machines (ARM), a central processing unit (CPU), an application specific integrated circuit (ASIC), a digital signal processing device (DSPD), a programmable logic device (PLD), a controller, a microcontroller, or a microprocessor. It can be understood that, other electronic device can also implement a processor function mentioned above, which is not specifically limited in implementations of the present disclosure.

At least one of the memory module, the computer storage medium, the memory, or the external slave may include: a register, a memory block, a read only memory (ROM), a random access memory (RAM), a dynamic random access memory (DRAM), a static random-access memory (SRAM), a synchronous dynamic random-access memory (SDRAM), a double data rate SDRAM (DDR SDRAM), an enhanced SDRAM (ESDRAM), a synchronous link DRAM (SLDRAM), direct Rambus RAM (DR RAM), a programmable read-only memory (PROM), an erasable programmable ROM (EPROM), an electrically EPROM (EEPROM), A ferromagnetic RAM (FRAM), a flash memory, a magnetic surface memory, an optical disk, a compact Disc ROM (a CD-ROM), and other memories. In other words, the memory in implementations of the present disclosure is intended to include, but not limited to, these and any other suitable types of memories.

It should be noted that implementations of the arbitration apparatus, the data processing apparatus, the arbitration device, the computer storage medium, the chip, and the computer program product are similar to the implementations of the methods in descriptions and beneficial effects. For technical details that are not disclosed in implementations of the storage medium and devices of the present disclosure, reference can be made to descriptions of method implementations of the present disclosure for understanding.

It should be noted that "0th", "first", "(M−1)-th", or the like are described in implementations of the present disclosure from the perspective of machines. It should be understood by those skilled in the art that the 0th processing unit from the perspective of machines represents the first processing unit in reality, the (M−1)-th processing unit from the perspective of machines represent the M-th processing unit in reality, and so on, which will not be described in the present disclosure one by one.

The "multiple" "a plurality of", "multiple times", and "a plurality of times" mentioned in implementations of the present disclosure should be understood as two or more and twice or more times. Unless otherwise specified, the normalized clock-cycle count refer to the normalized clock-cycle count corresponding to the N-th clock cycle.

It should be understood that reference to "one kind of implementations", "some implementations", "one implementation", "an implementation", "implementations of the present disclosure", or "foregoing implementations" throughout the description means that particular elements, structures, or characteristics associated with said implementation is included in at least one implementation of the present disclosure. Therefore, "one kind of implementations", "some implementations", "one implementation", "an implementation", "implementations of the present disclosure", or "foregoing implementations" mentioned in various places of the entire specification are not necessarily referring to the same implementation. Furthermore, the particular elements, structures, or characteristics may be combined in any suitable manner in one or more implementations. It should be understood that, in various implementations of the present disclosure, a sequence number of each of the foregoing processes does not imply an execution sequence, and the execution sequence of each of the processes should be determined according to a function and an internal logic of the processes, which should not constitute any limitation to an execution process of implementations of the present disclosure. Serial numbers in implementations of the present disclosure are only for description, and do not represent the preference of implementations.

Unless otherwise specified, the arbitration device executes any step in implementations of the present disclosure, or a processor of the arbitration device can execute any step in implementations of the present disclosure. Unless otherwise specified, a sequence in which the arbitration device executes following steps is not limited in implementation of the present disclosure. Additionally, data can be processed in different implementations by means of the same method or different methods. It should also be noted that any step in implementations of the present disclosure may be independently executed by the arbitration device, that is, the arbitration device can execute any step in the foregoing implementations without depending on execution of other steps.

In implementations of the present disclosure, a specific number of a letter or a character is not defined, for example, the number represented by M, Q, i, j, etc. can be determined according to actual situations and/or context, and a number represented by an undefined number of a letter or a character can be included in a range of integers.

In implementations of the present disclosure, the apparatus and the method disclosed in implementations provided herein may be implemented in other manners. For example, the device/apparatus implementations described above are merely illustrative; for instance, the division of the unit is only a logical function division and there can be other manners of division during actual implementations, for example, multiple units or components may be combined or may be integrated into another system, or some features may be ignored, omitted, or not performed. In addition, coupling, direct coupling, or communication connection between each illustrated or discussed component may be communication connection, or may be indirect coupling or communication among devices or units via some interfaces, and may be electrical connection, mechanical connection, or other forms of connection.

The units described as separate components may or may not be physically separated, the components illustrated as units may or may not be physical units, that is, they may be in the same place or may be distributed to multiple network elements. All or part of the units may be selected according to actual needs to achieve the purpose of the technical solutions of the embodiments.

In addition, the functional units in various embodiments of the present disclosure may be integrated into one processing unit, or each unit may be physically present, or two or more units may be integrated into one unit. The above-mentioned integrated unit can be implemented in the form of hardware or a software function unit.

The methods disclosed in the method implementations of the present disclosure may be combined randomly without conflicts to obtain new method implementations. Features disclosed in the product implementations of the present disclosure can be combined arbitrarily without conflicts to obtain new product implementations. The features disclosed in the method or device implementations of the present disclosure can be randomly combined without conflicts to obtain new method implementations or device implementations.

Those of ordinary skill in the art may understand that all or a part of operations of the method implementations may be implemented by means of a program to instruct associated hardware. The program may be stored in a computer-readable storage medium. When the program is executed, the program is operable to execute operations of the method implementations. The foregoing storage medium includes various mediums capable of storing program codes, such as a mobile storage device, an ROM, a magnetic disk, or an optical disc.

Alternatively, the integrated unit may be stored in a computer-readable memory when it is implemented in the form of a software functional unit and is sold or used as a separate product. Based on such understanding, the technical solutions of the present disclosure essentially, or the part of the technical solutions that contributes to the related art, or all or part of the technical solutions, may be embodied in the form of a software product which is stored in a memory and includes instructions for causing a computer device (which may be a personal computer, a server, or a network device and so on) to perform all or part of the steps described in the various embodiments of the present disclosure. The memory includes various medium capable of storing program codes, such as a USB (universal serial bus) flash disk, an ROM, an RAM, a removable hard disk, Disk, compact disc (CD), or the like.

The foregoing descriptions are merely implementations of the present disclosure, but are not intended to limit the scope of protection of the present disclosure. Any variation or replacement made by those of ordinary skill in the art within the technical scope disclosed in the present disclosure shall fall into the scope of protection of the present disclosure. Therefore, the scope of protection of the present disclosure shall be subject to the scope of protection of appended claims.

An arbitration method, apparatus, and device, a storage medium, a program product, and a chip are provided in implementations of the present disclosure, the target request to be sent to the memory module in the N-th clock cycle is determined among the P first requests, according to the normalized clock-cycle count corresponding to the N-th clock cycle and the P timeslot values determined from the first timeslot table. In this way, the target request sent to the memory module in the N-th clock cycle can be determined, thereby avoiding a case where the target request sent to the memory module in the N-th clock cycle is unable to be determined, thus improving an arbitration efficiency of an arbiter. In addition, the certainty that the arbitration module determines the target request among the P first requests is improved, thereby avoiding an uncertainty of a selected target request caused by randomly selecting a target request among the P first requests, and further satisfying arbitration requirements in different situations.

What is claimed is:
1. An arbitration method, comprising:
obtaining, in an N-th clock cycle, P first requests respectively sent by P processing modules among M processing modules, wherein the M processing modules are each configured to send a first request to a memory module via an arbitration module, M is an integer greater than or equal to P, N is an integer greater than or equal to zero, and P is an integer greater than or equal to two;
determining, from a first timeslot table, P timeslot values to be respectively allocated to identities (IDs) of the P processing modules; and
determining, among the P first requests, a target request to be sent to the memory module in the N-th clock cycle, according to i) a normalized clock-cycle count corresponding to the N-th clock cycle and ii) the P timeslot values.

2. The method according to claim 1, wherein the normalized clock-cycle count is the same as a value of N modulo M.

3. The method according to claim 1, wherein the first timeslot table corresponds to the N-th clock cycle, and the first timeslot table contains M timeslot values arranged in a specific order; and
determining, from the first timeslot table, the P timeslot values to be respectively allocated to the IDs of the P processing modules comprises:

determining, from the first timeslot table, timeslot values at locations of the IDs of the P processing modules as the P timeslot values.

4. The method according to claim 1, wherein determining, among the P first requests, the target request to be sent to the memory module in the N-th clock cycle, according to the normalized clock-cycle count corresponding to the N-th clock cycle and the P timeslot values comprises:
for each of the P timeslot values, determining an absolute difference between a timeslot value and the normalized clock-cycle count;
determining a target timeslot value corresponding to a minimum of the absolute difference for each of the P timeslot values; and
determining a first request sent by a processing module corresponding to the target timeslot value as the target request.

5. The method according to claim 1, further comprising:
determining the first timeslot table as a timeslot table corresponding to an (N+1)-th clock cycle, in response to a timeslot value at an i-th location in the first timeslot table corresponding to an ID of a processing module that sends the target request; wherein i is equal to the normalized clock-cycle count.

6. The method according to claim 1, further comprising:
updating the first timeslot table to obtain a second timeslot table, in response to a timeslot value at an i-th location in the first timeslot table not corresponding to an ID of a processing module that sends the target request; wherein i is equal to the normalized clock-cycle count; and
determining the second timeslot table as a timeslot table corresponding to the (N+1)-th clock cycle.

7. The method according to claim 6, wherein updating the first timeslot table to obtain the second timeslot table comprises:
determining, in the first timeslot table, a j-th location where a timeslot value corresponding to the ID of the processing module that sends the target request is located; and
obtaining the second timeslot table by interchanging the timeslot value at the i-th location with the timeslot value at the j-th location in the first timeslot table.

8. The method according to claim 1, wherein determining, from the first timeslot table, the P timeslot values to be respectively allocated to the IDs of the P processing modules comprises:
determining, from the first timeslot table, the P timeslot values to be respectively allocated to the IDs of the P processing modules, in response to none of the IDs of the P processing modules corresponding to the normalized clock-cycle count.

9. The method according to claim 1, wherein the method further comprises:
determining a first request sent by a processing module corresponding to a first ID as the target request, in response to the first ID among the IDs of the P processing modules corresponding to the normalized clock-cycle count.

10. The method according to claim 1, wherein the P first requests are sent by the P processing modules respectively in the N-th clock cycle; or, at least one of the P first requests is sent prior to the N-th clock cycle.

11. The method according to claim 1, wherein the M processing modules each comprises one of the following: a digital signal processing (DSP) core, a micro control unit (MCU), a field programmable gate array (FPGA), advanced reduced instruction set computer (RISC) machines (ARM), a central processing unit (CPU), and an application specific integrated circuit (ASIC); and
the memory module comprises one of the following: a memory block, a read-only memory (ROM), a random access memory (RAM), a dynamic random access memory (DRAM), a static random access memory (SRAM), a synchronous dynamic random access memory (SDRAM), and a double data rate (DDR) SDRAM.

12. The method according to claim 1, wherein the first request comprises a read request for reading data from the memory module, or a write request for writing data into the memory module.

13. The method according to claim 12, wherein in response to the first request being the read request, the arbitration module receives, in an (N+3)-th clock cycle, request data sent by the memory module to a processing module that sends the target request.

14. The method according to claim 1, wherein the arbitration module receives, in an (N+4)-th clock cycle or after the (N+4)-th clock cycle, a first request sent to the memory module by a processing module that sends the target request.

15. An arbitration device comprising:
a memory configured to store a computer program capable of running on a processor; and
the processor configured to:
obtain, in an N-th clock cycle, P first requests respectively sent by P processing modules among M processing modules, wherein the M processing modules are each configured to send a first request to a memory module via an arbitration module, M is an integer greater than or equal to P, N is an integer greater than or equal to zero, and P is an integer greater than or equal to two;
determine, from a first timeslot table, P timeslot values to be respectively allocated to identities (IDs) of the P processing modules; and
determine, among the P first requests, a target request to be sent to the memory module in the N-th clock cycle, according to i) a normalized clock-cycle count corresponding to the N-th clock cycle and ii) the P timeslot values.

16. The device according to claim 15, wherein the normalized clock-cycle count is the same as a value of N modulo M.

17. The device according to claim 15, wherein the first timeslot table corresponds to the N-th clock cycle, and the first timeslot table contains M timeslot values arranged in a specific order; and
in terms of determining, from the first timeslot table, the P timeslot values to be respectively allocated to the IDs of the P processing modules, the processor is configured to determine, from the first timeslot table, timeslot values at locations of the IDs of the P processing modules as the P timeslot values.

18. The device according to claim 15, wherein in terms of determining, among the P first requests, the target request to be sent to the memory module in the N-th clock cycle, according to the normalized clock-cycle count corresponding to the N-th clock cycle and the P timeslot values, the processor is configured to:
for each of the P timeslot values, determine an absolute difference between a timeslot value and the normalized clock-cycle count;

determine a target timeslot value corresponding to a minimum of the absolute difference for each of the P timeslot values; and determine a first request sent by a processing module corresponding to the target timeslot value as the target request.

19. The device according to claim 15, wherein the arbitration device comprises one of: a modulator, a demodulator, or a modem.

20. A non-transitory computer-readable storage medium storing one or more programs, wherein the one or more programs are executable by one or more processors to implement:

obtaining, in an N-th clock cycle, P first requests respectively sent by P processing modules among M processing modules, wherein the M processing modules are each configured to send a first request to a memory module via an arbitration module, M is an integer greater than or equal to P, N is an integer greater than or equal to zero, and P is an integer greater than or equal to two;

determining, from a first timeslot table, P timeslot values to be respectively allocated to identities (IDs) of the P processing modules; and determining, among the P first requests, a target request to be sent to the memory module in the N-th clock cycle, according to i) a normalized clock-cycle count corresponding to the N-th clock cycle and ii) the P timeslot values.

* * * * *